(12) United States Patent
Kawai et al.

(10) Patent No.: US 9,378,817 B2
(45) Date of Patent: Jun. 28, 2016

(54) VARIABLE RESISTANCE NONVOLATILE MEMORY ELEMENT WRITING METHOD AND VARIABLE RESISTANCE NONVOLATILE MEMORY DEVICE

(75) Inventors: Ken Kawai, Osaka (JP); Kazuhiko Shimakawa, Osaka (JP); Yoshikazu Katoh, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 691 days.

(21) Appl. No.: 13/581,925

(22) PCT Filed: Mar. 22, 2012

(86) PCT No.: PCT/JP2012/001975
§ 371 (c)(1),
(2), (4) Date: Aug. 30, 2012

(87) PCT Pub. No.: WO2012/132341
PCT Pub. Date: Oct. 4, 2012

(65) Prior Publication Data
US 2013/0188414 A1  Jul. 25, 2013

(30) Foreign Application Priority Data

Mar. 25, 2011 (JP) ................................. 2011-068556

(51) Int. Cl.
*G11C 11/00* (2006.01)
*G11C 13/00* (2006.01)

(52) U.S. Cl.
CPC ........ *G11C 13/0069* (2013.01); *G11C 13/0007* (2013.01); *G11C 13/0064* (2013.01); *G11C 2013/0073* (2013.01); *G11C 2013/0083* (2013.01); *G11C 2013/0092* (2013.01)

(58) Field of Classification Search
CPC .......... G11C 13/0069; G11C 13/0064; G11C 13/0007; G11C 2013/0073; G11C 2013/0092; G11C 2013/0083
USPC .............................................. 365/148, 189.16
See application file for complete search history.

(56) References Cited

U.S. PATENT DOCUMENTS

| 5,287,317 A | 2/1994 | Kobayashi et al. |
| 6,888,745 B2 | 5/2005 | Ehiro et al. |

(Continued)

FOREIGN PATENT DOCUMENTS

| CN | 101622673 | 1/2010 |
| JP | 2004-185756 | 7/2004 |

(Continued)

OTHER PUBLICATIONS

Office Action with Search Report issued Feb. 25, 2014 in corresponding Chinese patent application No. 201280000807.4 with English translation of search report.

*Primary Examiner* — Pho M Luu
*Assistant Examiner* — Mohammed A Bashar
(74) *Attorney, Agent, or Firm* — Wenderoth, Lind & Ponack, L.L.P.

(57) ABSTRACT

A variable resistance nonvolatile memory element writing method of, by applying a voltage pulse to a memory cell including a variable resistance element, reversibly changing the variable resistance element between a first resistance state and a second resistance state according to a polarity of the applied voltage pulse is provided. The variable resistance nonvolatile memory element writing method includes applying a first preliminary voltage pulse and subsequently applying the first voltage pulse to the variable resistance element to change the variable resistance element from the second resistance state to the first resistance state, the first preliminary voltage pulse being smaller in voltage absolute value than the second threshold voltage and different in polarity from the first voltage pulse.

18 Claims, 22 Drawing Sheets

(56) References Cited

U.S. PATENT DOCUMENTS

| | | |
|---|---|---|
| 7,006,371 B2 | 2/2006 | Matsuoka |
| 7,583,525 B2 | 9/2009 | Shiimoto et al. |
| 7,916,516 B2 | 3/2011 | Wei et al. |
| 8,305,795 B2 * | 11/2012 | Azuma ............ G11C 13/0007 365/148 |
| 8,848,421 B2 * | 9/2014 | Kawai ................ G11C 13/0007 365/148 |
| 2004/0114429 A1 | 6/2004 | Ehiro et al. |
| 2004/0114444 A1 | 6/2004 | Matsuoka |
| 2007/0247894 A1 | 10/2007 | Shiimoto et al. |
| 2010/0110766 A1 | 5/2010 | Wei et al. |
| 2010/0271860 A1 | 10/2010 | Muraoka et al. |
| 2011/0044088 A1 * | 2/2011 | Muraoka et al. ............. 365/148 |
| 2011/0051500 A1 | 3/2011 | Takagi et al. |
| 2011/0110143 A1 | 5/2011 | Kanzawa et al. |
| 2011/0176351 A1 | 7/2011 | Fujitsuka et al. |
| 2012/0327702 A1 | 12/2012 | Takagi et al. |
| 2013/0188414 A1 | 7/2013 | Kawai et al. |

FOREIGN PATENT DOCUMENTS

| | | |
|---|---|---|
| JP | 2004-234707 | 8/2004 |
| JP | 2007-4935 | 1/2007 |
| JP | 2007-294592 | 11/2007 |
| JP | 2011-146111 | 7/2011 |
| WO | 2008/153124 | 12/2008 |
| WO | 2010/038442 | 4/2010 |
| WO | 2010/064446 | 6/2010 |
| WO | 2010/116754 | 10/2010 |
| WO | 2012/132341 | 10/2012 |

* cited by examiner

|VL| > |VH|

| VH1 | < | VL |

VARIABLE RESISTANCE NONVOLATILE MEMORY ELEMENT WRITING METHOD AND VARIABLE RESISTANCE NONVOLATILE MEMORY DEVICE

TECHNICAL FIELD

The present invention relates to a variable resistance nonvolatile memory element writing method and a variable resistance nonvolatile memory device. The present invention especially relates to a writing method for stably sustaining a resistance change of a variable resistance nonvolatile memory element that reversibly changes in resistance value based on an electrical signal, and to a variable resistance nonvolatile memory device.

BACKGROUND ART

Nonvolatile memory devices are widely installed in mobile devices such as mobile phones and digital cameras, and are finding rapidly increasing use. Recent years have seen more opportunities to handle audio data and image data, creating a growing demand for nonvolatile memory devices that have larger capacity and operate faster than ever. There is also a pressing need for lower power consumption of nonvolatile memory devices for use in mobile devices.

A flash memory is a predominant nonvolatile memory device today. In the flash memory, data is written by controlling a charge accumulated on a floating gate. Since the flash memory has a structure of accumulating a charge on a floating gate in a high electric field, its miniaturization is limited, and microfabrication necessary to attain larger capacity is difficult. Besides, to rewrite the flash memory, a predetermined block needs to be erased at a time. Due to such a property, rewriting the flash memory requires a very long time. This poses random access and speed-up limitations.

As a next-generation nonvolatile memory device for solving these problems, there is a nonvolatile memory device using a variable resistance element in which information is written by a change in electrical resistance. As such a nonvolatile semiconductor device (also referred to as "nonvolatile memory") using a variable resistance element, an MRAM (Magnetic RAM), a PCRAM (Phase-Change RAM), a ReRAM (Resistive RAM), and the like are currently proposed (see, for example, Patent Literatures (PTLs) 1 to 3).

CITATION LIST

Patent Literature

[PTL 1]
Japanese Unexamined Patent Application Publication No. 2004-185756
[PTL 2]
The specification of U.S. Pat. No. 5,287,317
[PTL 3]
Japanese Unexamined Patent Application Publication No. 2004-234707

SUMMARY OF INVENTION

Technical Problem

However, for example in a conventional variable resistance element-use nonvolatile memory device using a bipolar ReRAM, a failure in writing occurs when a verification operation and ensuing additional writing are performed.

The present invention has been made in view of the above-mentioned circumstances, and has an object of providing a variable resistance nonvolatile memory element writing method for improving stability and reliability in a writing operation.

Solution to Problem

To achieve the stated object, a variable resistance nonvolatile memory device writing method according to one aspect of the present invention is a variable resistance nonvolatile memory element writing method of, by applying a voltage pulse to a memory cell including a variable resistance nonvolatile memory element, reversibly changing the variable resistance nonvolatile memory element between a first resistance state and a second resistance state according to a polarity of the applied voltage pulse, wherein the variable resistance nonvolatile memory element includes a first electrode, a second electrode, and a variable resistance layer placed between the first electrode and the second electrode, the variable resistance layer includes an oxygen-deficient first transition metal oxide layer that is in contact with the first electrode, and a second transition metal oxide layer that is in contact with the second electrode and is lower in oxygen deficiency than the first transition metal oxide layer, and the variable resistance nonvolatile memory element has characteristics of changing to the first resistance state when, with respect to one of the first electrode and the second electrode, a first voltage pulse having a positive potential and equal to or more than a first threshold voltage is applied to an other one of the first electrode and the second electrode, and changing to the second resistance state when, with respect to the other one of the first electrode and the second electrode, a second voltage pulse having a positive potential and equal to or more than a second threshold voltage is applied to the one of the first electrode and the second electrode, the variable resistance nonvolatile memory element writing method including applying a first preliminary voltage pulse and subsequently applying the first voltage pulse to the variable resistance nonvolatile memory element when changing the variable resistance nonvolatile memory element from the second resistance state to the first resistance state, the first preliminary voltage pulse being smaller in voltage absolute value than the second threshold voltage and different in polarity from the first voltage pulse.

Advantageous Effects of Invention

According to the present invention, a variable resistance nonvolatile memory element writing method for improving stability and reliability in a writing operation can be realized.

DESCRIPTION OF EMBODIMENTS (Circumstances Leading to Attainment of One Aspect of the Present Invention)

The present inventors have found the following problem with the conventional nonvolatile memory devices described in the Background Art section. The problem is described below.

PTL 1 discloses an example of a control method of a bipolar ReRAM element using an oxide having a perovskite structure. Here, "bipolar" means that, through the use of voltage pulses of different polarities, the ReRAM element changes to a high resistance state by the voltage pulse of one polarity and changes to a low resistance state by the voltage pulse of the other polarity. The ReRAM element is an element capable of reversibly changing at least between a low resistance state (also referred to as "LR state" or simply "LR") and a high resistance state (also referred to as "HR state" or simply "HR") higher in resistance value than the low resistance state by electrical stimulation, representing a nonvolatile semiconductor device for writing information according to the low resistance state or the high resistance state.

The following describes the ReRAM element control method with reference to drawings.

Figure 19:
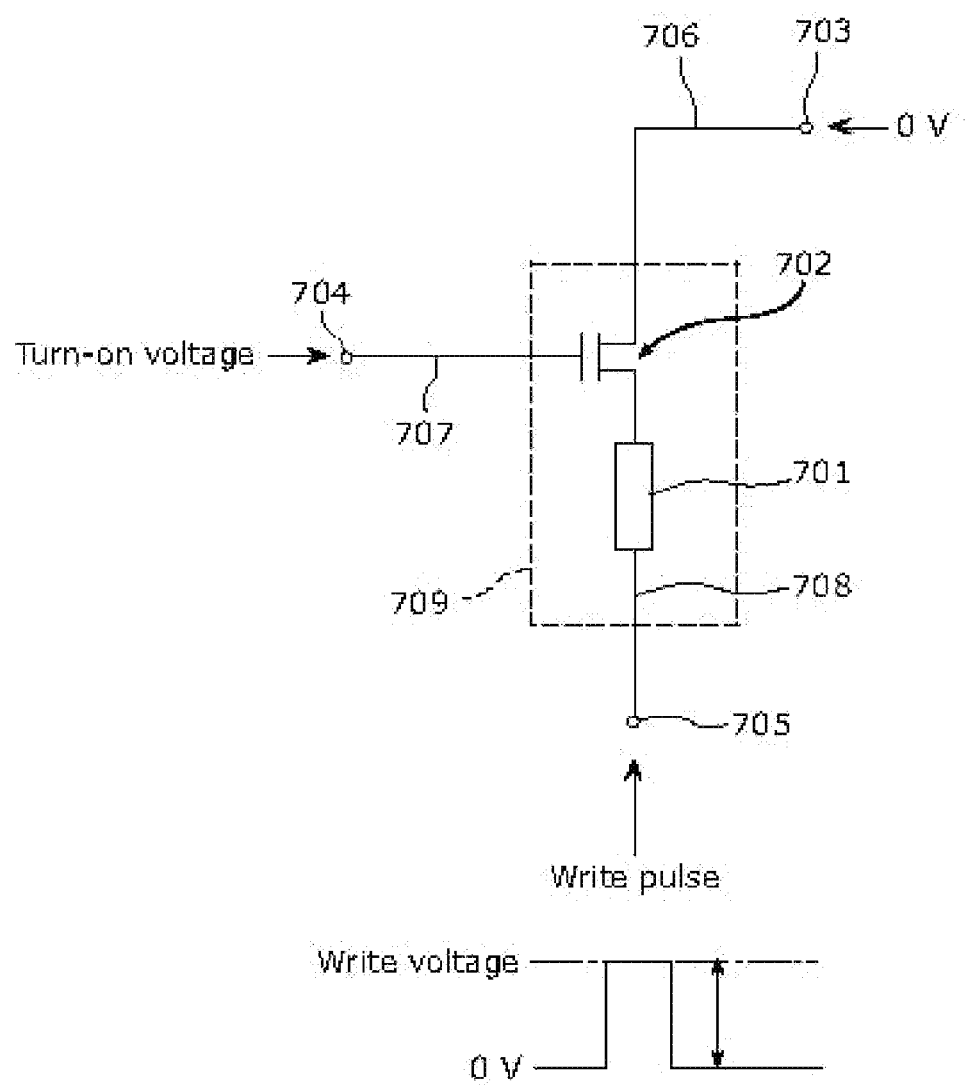
FIG. 19 is a diagram showing a voltage pulse application state in an operation of writing a memory cell in PTL 1 in conventional art.
Figure 20:
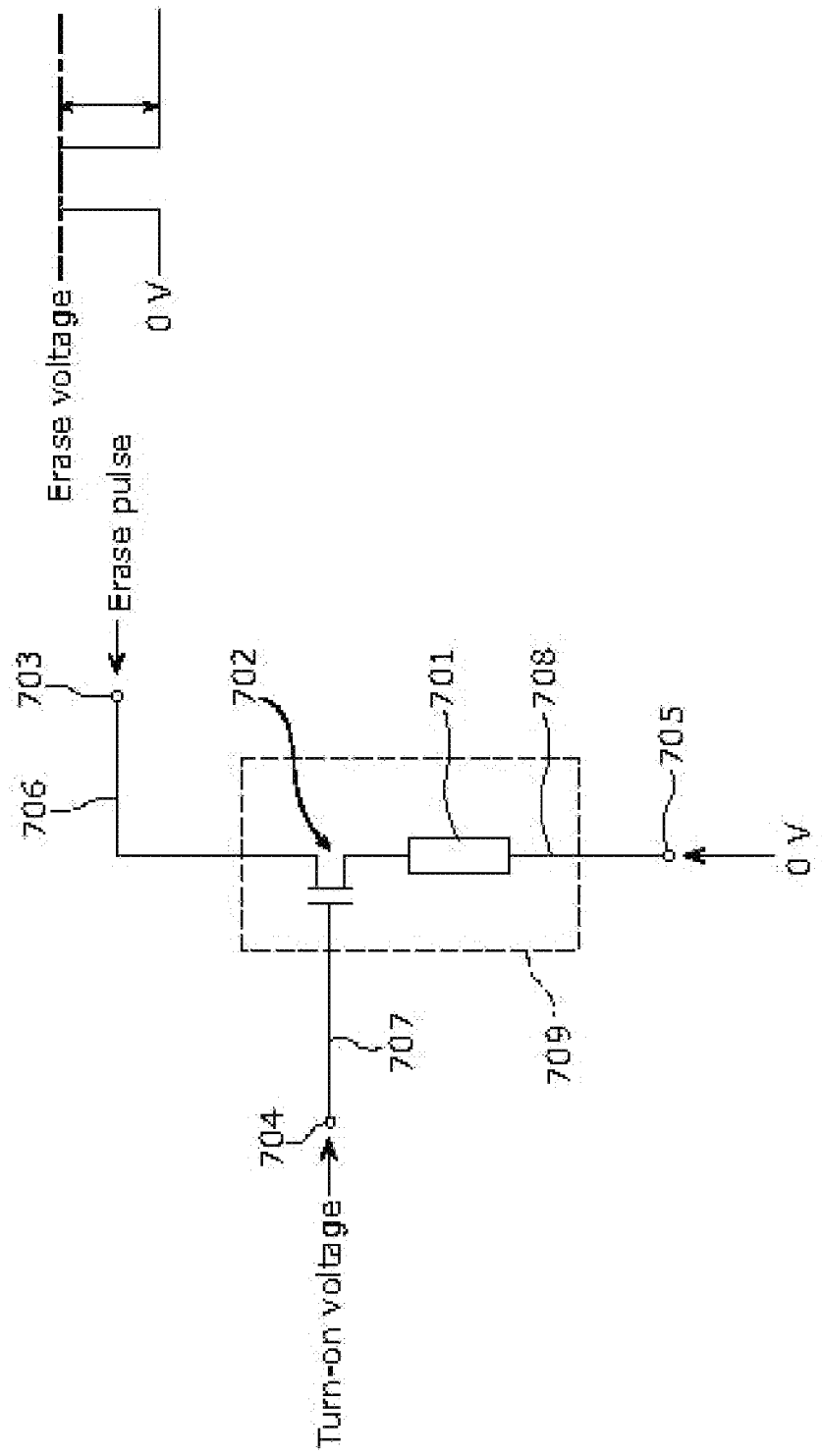
FIG. 20 is a diagram showing a voltage pulse application state in an operation of erasing a memory cell in PTL 1 in conventional art.
Figure 21:
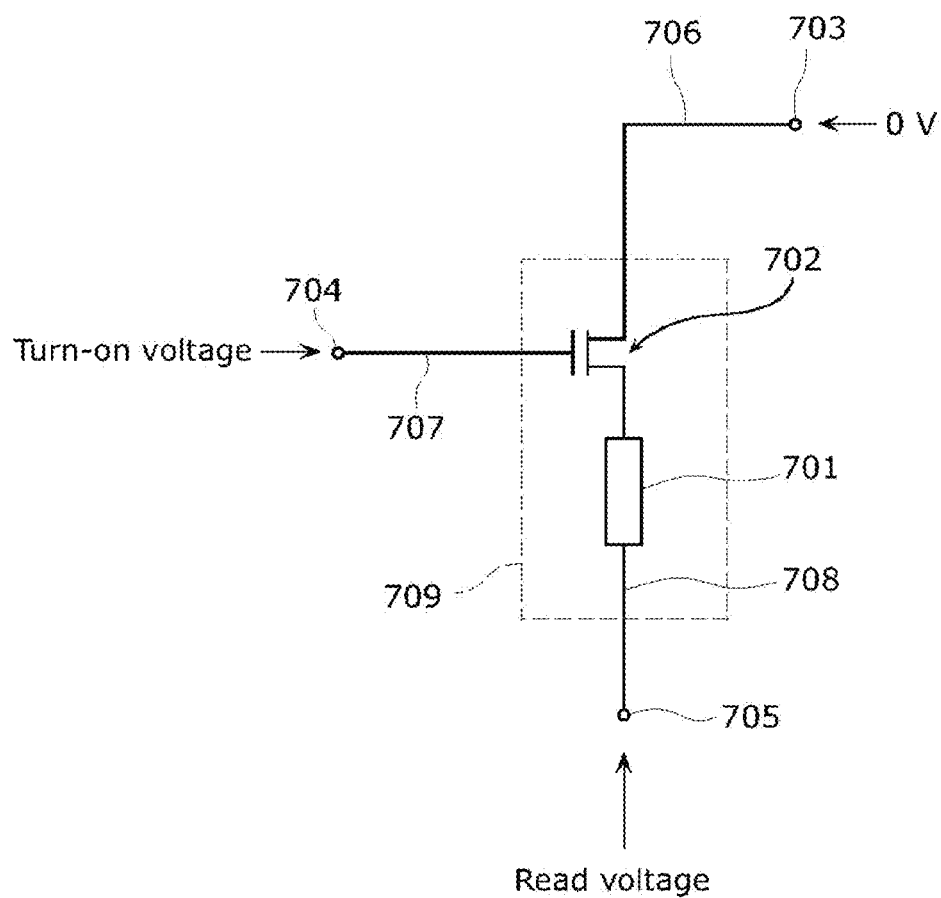
FIG. 21 is a diagram showing a voltage pulse application state in an operation of reading a memory cell in PTL 1 in conventional art.

FIGS. 19 to 21 are diagrams showing a structure and a control method of a memory cell 709 disclosed in PTL 1. The memory cell 709 includes a variable resistance element 701 and a selection transistor 702. One terminal of the variable resistance element 701 and one main terminal (drain or source) of the selection transistor 702 are electrically connected to each other. The other main terminal (source or drain) of the selection transistor 702 is electrically connected to a source line terminal 703 by a source line 706. The other terminal of the variable resistance element 701 is electrically connected to a bit line terminal 705 by a bit line 708. A gate of the selection transistor 702 is electrically connected to a word line terminal 704 by a word line 707. In each of the case of writing data (writing "1" (here, the data "1" is assigned to the HR state of the ReRAM element)), the case of erasing (writing "0" (here, the data "0" is assigned to the LR state of the ReRAM element)), and the case of reading, a turn-on voltage of a high level is applied to the word line terminal 704 of the selected memory cell to set the selection transistor 702 in a conductive state.

FIG. 19 is a diagram showing a voltage pulse application state in an operation of writing the memory cell 709 in PTL 1. The source line 706 is set to 0 V (ground), and a positive write pulse with a predetermined write voltage amplitude is applied to the bit line 708, to write desired data to the variable resistance element 701. In the case of writing multi-value information to the variable resistance element 701, the voltage amplitude of the write pulse is set to a level corresponding to the write data. For example, in the case of writing four-value data to one variable resistance element 701, one of predetermined four voltage amplitudes determined in correspondence with the four values of the write data is selected and a writing operation is performed. Moreover, an appropriate width according to the element is selected as a write pulse width. Thus, there are a voltage amplitude level and a pulse width corresponding to a predetermined resistance state, to enable a change to the predetermined resistance state.

FIG. 20 is a diagram showing a voltage pulse application state in an operation of erasing the memory cell 709 in PTL 1. The bit line 708 is set to 0 V (ground), and a positive erase pulse with a predetermined erase voltage amplitude is applied to the source line 706. Applying the erase pulse minimizes the electrical resistance of the variable resistance element 701. PTL 1 discloses that, when the erase pulse is applied to a specific source line 706 in a state where a plurality of bit lines 708 are set to 0 V, a plurality of memory cells connected to the plurality of bit lines 708 and the source line 706 are simultaneously erased at a time.

FIG. 21 is a diagram showing a voltage pulse application state in an operation of reading the memory cell 709 in PTL 1. In the case of reading data written in the variable resistance element 701, the source line 706 is set to 0 V (ground), and a predetermined read voltage is applied to the selected bit line 708 through a read circuit. When the read voltage is applied, the level of the bit line 708 is compared with a reference level for reading in a comparison/determination circuit, and the written data is read.

Figure 22:
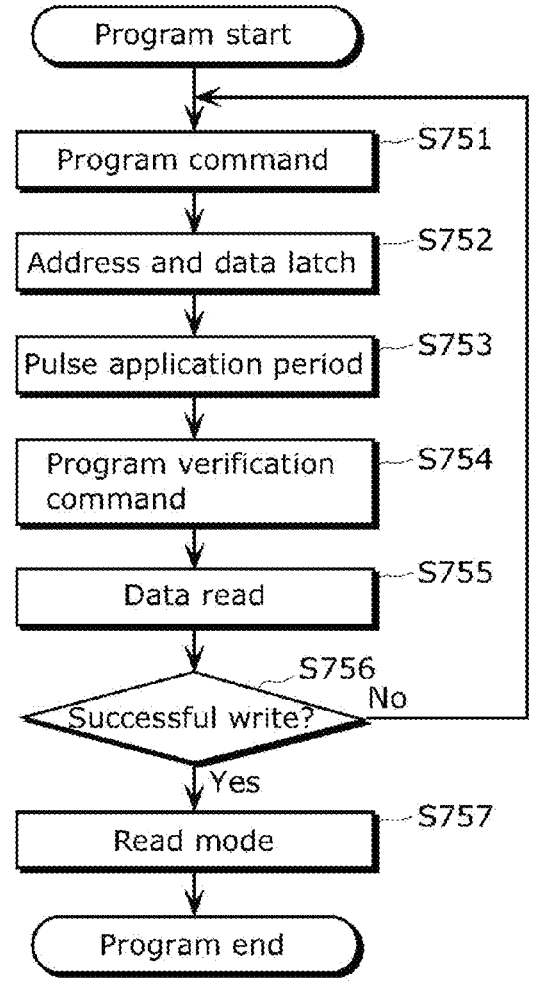
FIG. 22 is a flowchart of a conventional verification operation in PTLS 2 and 3 in conventional art.
Figure 23:
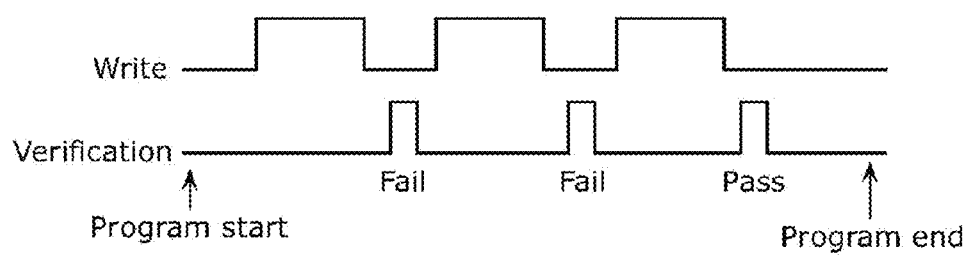
FIG. 23 is a timing chart showing a flow of the conventional verification operation in PTLs 2 and 3 in conventional art.

PTLs 2 and 3 propose a verification operation for verifying, in a typical electrically-erasable and programmable semiconductor memory or a variable resistance memory of a ReRAM, whether or not a written electrical state satisfies a desired threshold, to improve written data reliability. As shown in FIG. 22, in the case of data writing, after input of a program command (e.g. "write") (Step S751), addresses and data are inputted and latched (Step S752). This initiates program pulse application to a selected memory cell, and data is written to the memory cell (Step S753). After the program pulse application ends, a program verification command is inputted to set a program verification mode (Step S754), and data reading from the written memory cell starts (Step S755). After reading the data, the read data is compared with initially inputted expected value data (Step S756). In the case where the read data matches the expected value data (Step S756: Yes), the program verification mode completes successfully. The operation mode then changes to a read mode (Step S757), thus ending the program. In the case where the read data does not match the expected value data (Step S756: No), on the other hand, program pulse application is performed again for additional writing (Steps S751 to S753). This series of operations is repeatedly performed until all data match. Practically, however, an upper limit is often imposed on the number of repetitions to prevent an infinite loop. FIG. 23 is a timing chart showing a situation where, after program pulse application, the series of operations for the verification operation is carried out and, when the written data and the expected value data match in the third verification operation, the program ends. Thus, the verification operation can ensure that an electrical state written to the nonvolatile semiconductor device satisfies a desired level and has a sufficient margin with respect to a threshold referenced to restore original digital information, with it being possible to further improve data reliability.

However, for example in a conventional variable resistance element-use nonvolatile memory device using a bipolar ReRAM, a failure in writing occurs when a verification operation and ensuing additional writing are performed. The failure is described below.

Suppose, to improve operational stability and reliability in a nonvolatile memory device using a ReRAM, after an operation of writing the ReRAM, a written resistance level is checked by a verification operation, and additional writing is performed in the case where a desired resistance value is not satisfied. However, even though the desired resistance value is satisfied in the verification operation executed immediately after the writing operation, the written resistance value gradually changes over a short period of time afterward, eventually to a level that cannot satisfy the threshold resistance value used for verification. A writing failure occurs in this way.

Typically, a physical quantity written to a memory cell tends to change when left for a long time or left at a high temperature, when deterioration in material composition is caused by a number of rewrite cycles, or the like. Based on reliability specifications required in regard to such a change, writing is required to be performed so that a physical quantity in a write initial stage satisfies a predetermined condition. That is, writing is performed so as to secure an appropriate margin between a written physical quantity and a predetermined threshold when the written physical quantity is compared with the threshold to restore original digital data. The verification operation is executed to secure such a margin. However, if the written physical quantity suddenly changes so as to approach the threshold immediately after the written physical quantity is determined to satisfy the intended level as a result of the verification operation, the above-mentioned margin cannot be secured, making it impossible to ensure required reliability. This is a critical problem for the nonvolatile memory. The ReRAM has advantages such as excellent high-speed performance of being capable of writing in such a short time as several tens of nanoseconds, and excellent reliability of being capable of data retention for a long time even in a high temperature environment once data can be successfully written. The ReRAM therefore possesses high potential as a next-generation semiconductor memory that can replace the conventional semiconductor memory. However, even though bits whose writing failures cannot be found by the verification operation rarely occur, the occurrence of such bits makes it impossible for the device as a whole to benefit from the excellent performance of the ReRAM.

In view of this problem, the present inventors have discovered that the number of bits having writing failures can be significantly improved by a unique writing step.

As mentioned above, the main problem with the writing failure phenomenon is that, due to an insufficient writing condition, the written resistance value changes after the verification operation is executed, causing the bit to fall below the threshold level for verification. Such failure bits occur randomly in the memory cell array. In the verification operation executed immediately after the data is written to the memory cell, whether or not the data is successfully written cannot be determined, and the above-mentioned failure is overlooked. The verification operation is intended to provide the predetermined margin in order to ensure data reliability required of the nonvolatile semiconductor device in regard to deterioration factors such as long-term retention, high-temperature retention, and a large number of rewrite cycles. However, when the above-mentioned failure occurs, the necessary margin cannot be secured by verification, and reliability required in data reading can no longer be ensured.

In view of the above-mentioned circumstances, the present inventors have conceived a variable resistance nonvolatile memory element writing method for improving stability and reliability in a writing operation. In detail, the present inventors have conceived a variable resistance nonvolatile memory element writing method for stably sustaining a resistance change operation by suppressing an operating window reduction caused by an increase of the number of rewrite cycles.

To achieve the stated object, a variable resistance nonvolatile memory element writing method according to one aspect of the present invention is a variable resistance nonvolatile memory element writing method of, by applying a voltage pulse to a memory cell including a variable resistance nonvolatile memory element, reversibly changing the variable resistance nonvolatile memory element between a first resistance state and a second resistance state according to a polarity of the applied voltage pulse, wherein the variable resistance nonvolatile memory element includes a first electrode, a second electrode, and a variable resistance layer placed between the first electrode and the second electrode, the variable resistance layer includes an oxygen-deficient first transition metal oxide layer that is in contact with the first electrode, and a second transition metal oxide layer that is in contact with the second electrode and is lower in oxygen deficiency than the first transition metal oxide layer, and the variable resistance nonvolatile memory element has characteristics of changing to the first resistance state when, with respect to one of the first electrode and the second electrode, a first voltage pulse having a positive potential and equal to or more than a first threshold voltage is applied to an other one of the first electrode and the second electrode, and changing to the second resistance state when, with respect to the other one of the first electrode and the second electrode, a second voltage pulse having a positive potential and equal to or more than a second threshold voltage is applied to the one of the first electrode and the second electrode, the variable resistance nonvolatile memory element writing method including applying a first preliminary voltage pulse and subsequently applying the first voltage pulse to the variable resistance nonvolatile memory element when changing the variable resistance nonvolatile memory element from the second resistance state to the first resistance state, the first preliminary voltage pulse being smaller in voltage absolute value than the second threshold voltage and different in polarity from the first voltage pulse.

According to this method, by applying an appropriate preliminary voltage pulse that differs in polarity from the corresponding one of the voltage pulse for high resistance writing and the voltage pulse for low resistance writing beforehand, the high resistance writing capability and the low resistance writing capability can be improved. As a result, even when the number of rewrite cycles increases, an appropriate operating window can be secured, which contributes to improved reliability of the nonvolatile memory device. Thus, a variable resistance nonvolatile memory element writing method for stably sustaining a resistance change operation by suppressing an operating window reduction caused by endurance deterioration (increase of the number of rewrite cycles) can be realized.

Moreover, the applying the first preliminary voltage pulse and subsequently applying the first voltage pulse may be repeatedly performed to change the variable resistance nonvolatile memory element from the second resistance state to the first resistance state.

Moreover, the first resistance state may be a high resistance state, wherein the second resistance state is a low resistance state that is lower in resistance than the high resistance state. Alternatively, the first resistance state may be a low resistance state, wherein the second resistance state is a high resistance state that is higher in resistance than the low resistance state.

Moreover, the variable resistance nonvolatile memory element writing method may further include determining whether or not first resistance state writing is completed, the first resistance state writing being writing for changing the variable resistance nonvolatile memory element to the first resistance state by the applying the first preliminary voltage pulse and subsequently applying the first voltage pulse, wherein the determining is performed after the applying the first preliminary voltage pulse and subsequently applying the first voltage pulse, and the applying the first preliminary voltage pulse and subsequently applying the first voltage pulse and the determining are repeatedly performed until the variable resistance nonvolatile memory element reaches the first resistance state.

According to this method, by setting a larger number of times the resistance change voltage pulse set is successively applied for a weaker one of the high resistance writing capability and the low resistance writing capability, appropriate balance between the high resistance writing capability and the low resistance writing capability can be attained without increasing the write voltage. As a result, even when the number of rewrite cycles increases, an appropriate operating window can be secured, which contributes to significantly improved reliability of the nonvolatile memory device. In addition, a low voltage operation can be achieved.

Moreover, the variable resistance nonvolatile memory element writing method may further include applying a second preliminary voltage pulse and subsequently applying the second voltage pulse to the variable resistance nonvolatile memory element when changing the variable resistance nonvolatile memory element from the first resistance state to the second resistance state, the second preliminary voltage pulse being smaller in voltage absolute value than the first threshold voltage and different in polarity from the second voltage pulse.

Moreover, the applying the second preliminary voltage pulse and subsequently applying the second voltage pulse may be repeatedly performed to change the variable resistance nonvolatile memory element from the first resistance state to the second resistance state.

Moreover, the variable resistance nonvolatile memory element writing method may further include: determining whether or not first resistance state writing is completed, the first resistance state writing being writing for changing the variable resistance nonvolatile memory element to the first resistance state by applying the first voltage pulse in the applying the first preliminary voltage pulse and subsequently applying the first voltage pulse; and determining whether or not second resistance state writing is completed, the second resistance state writing being writing for changing the variable resistance nonvolatile memory element to the second resistance state by applying the second voltage pulse in the applying the second preliminary voltage pulse and subsequently applying the second voltage pulse, wherein the determining whether or not the first resistance state writing is completed is performed after the applying the first preliminary voltage pulse and subsequently applying the first voltage pulse, the determining whether or not the second resistance state writing is completed is performed after the applying the second preliminary voltage pulse and subsequently applying the second voltage pulse, the applying the first preliminary voltage pulse and subsequently applying the first voltage pulse and the determining whether or not the first resistance state writing is completed are repeatedly performed until the variable resistance nonvolatile memory element reaches the first resistance state, and the applying the second preliminary voltage pulse and subsequently applying the second voltage pulse and the determining whether or not the second resistance state writing is completed are repeatedly performed until the variable resistance nonvolatile memory element reaches the second resistance state.

Moreover, the first transition metal oxide layer and the second transition metal oxide layer may comprise a transition metal that is any of tantalum, hafnium, and zirconium.

Moreover, the first transition metal oxide layer may comprise a first transition metal, wherein the second transition metal oxide layer comprises a second transition metal different from the first transition metal, and the second transition metal has a lower standard electrode potential than the second transition metal.

Moreover, the first transition metal oxide layer may have a composition expressed as $TaO_x$ where $0.8 \leq x \leq 1.9$, wherein the second transition metal oxide layer has a composition expressed as $TaO_y$ where $x<y$.

Moreover, to achieve the stated object, a variable resistance nonvolatile memory device according to one aspect of the present invention is a variable resistance nonvolatile memory device including: a memory cell including a variable resistance nonvolatile memory element; and a write control unit that, by applying a voltage pulse to the memory cell, performs writing for reversibly changing the variable resistance nonvolatile memory element between a first resistance state and a second resistance state according to a polarity of the applied voltage pulse, wherein the variable resistance nonvolatile memory element includes a first electrode, a second electrode, and a variable resistance layer placed between the first electrode and the second electrode, the variable resistance layer includes an oxygen-deficient first transition metal oxide layer that is in contact with the first electrode, and a second transition metal oxide layer that is in contact with the second electrode and is lower in oxygen deficiency than the first transition metal oxide layer, the variable resistance nonvolatile memory element has characteristics of changing to the first resistance state when, with respect to one of the first electrode and the second electrode, a first voltage pulse having a positive potential and equal to or more than a first threshold voltage is applied to an other one of the first electrode and the second electrode, and changing to the second resistance state when, with respect to the other one of the first electrode and the second electrode, a second voltage pulse having a positive potential and equal to or more than a second threshold voltage is applied to the one of the first electrode and the second electrode, and the write control unit applies a first preliminary voltage pulse and subsequently applies the first voltage pulse to the variable resistance nonvolatile memory element when changing the variable resistance nonvolatile memory element from the second resistance state to the first resistance state, the first preliminary voltage pulse being smaller in voltage absolute value than the second threshold voltage and different in polarity from the first voltage pulse.

Moreover, the memory cell may further include a switching element that is connected in series with the variable resistance nonvolatile memory element.

According to the present invention, a variable resistance nonvolatile memory element writing method for improving stability and reliability in a writing operation can be realized. That is, a variable resistance nonvolatile memory element writing method for stably sustaining a resistance change operation by suppressing an operating window reduction caused by an increase of the number of rewrite cycles can be realized.

In more detail, in the variable resistance nonvolatile memory element writing method according to the present invention, by applying an appropriate preliminary voltage pulse that differs in polarity from the corresponding one of the voltage pulse for high resistance writing and the voltage pulse for low resistance writing before the corresponding one of the voltage pulse for high resistance writing and the voltage pulse for low resistance writing, the high resistance writing capability and the low resistance writing capability can be improved. As a result, even when the number of rewrite cycles increases, an appropriate operating window can be secured, which contributes to improved reliability of the nonvolatile memory device. Furthermore, by setting a larger number of times the resistance change voltage pulse set is successively applied for a weaker one of the high resistance writing capability and the low resistance writing capability, appropriate balance between the high resistance writing capability and the low resistance writing capability can be attained without increasing the write voltage. As a result, even when the number of rewrite cycles increases, an appropriate operating window can be secured, which contributes to significantly improved reliability of the nonvolatile memory device. In addition, a low voltage operation can be achieved.

Note that the variable resistance nonvolatile memory element writing method and the variable resistance nonvolatile memory device described above are applicable as a semiconductor integrated circuit (LSI) including all or part of the functions of the variable resistance nonvolatile memory element.

The following describes embodiments of the present invention in detail, with reference to drawings. The embodiments described below each represent a preferred embodiment of the present invention. The numerals, forms, materials, components, component layout positions, connections, steps, step sequences, and the like described in the embodiments are merely examples, and should not limit the scope of the present invention. The components that are included in the embodiments but are not defined in the independent claims representing the broadest concepts of the present invention are described as components constituting more preferred embodiments.

As one type of variable resistance nonvolatile memory device, the following describes a variable resistance nonvolatile memory device including memory cells each of which includes a switching element and a variable resistance element having a variable resistance layer comprising an oxygen-deficient oxide (tantalum oxide) of tantalum (Ta) which is a transition metal. The oxygen-deficient oxide is an oxide that is deficient in oxygen content compared to its stoichiometric composition. As a variable resistance nonvolatile memory device using variable resistance elements, the following nonvolatile memory device is described as an example below. In the nonvolatile memory device, 1T1R memory cells in each of which a MOS transistor and a variable resistance element are connected in series with each other are arrayed in a matrix at about crosspoints of orthogonally arranged bit lines and word lines. In each 1T1R memory cell, the two-terminal variable resistance element has one terminal connected to one of a bit line and a source line, and the other terminal connected to a drain or a source of the transistor. A gate of the transistor is connected to a word line. The other terminal of the transistor is connected to the other one of the bit line and the source line to which the terminal of the variable resistance element is not connected. The source line is in parallel with the bit line or the word line. Note that the memory cell structure is not limited to 1T1R. As another example of the memory cell structure, 1D1R crosspoint memory cells each having a diode and a variable resistance element connected in series with each other at crosspoints of orthogonally arranged bit lines and word lines may be used.

[Embodiment 1]

Figure 1:
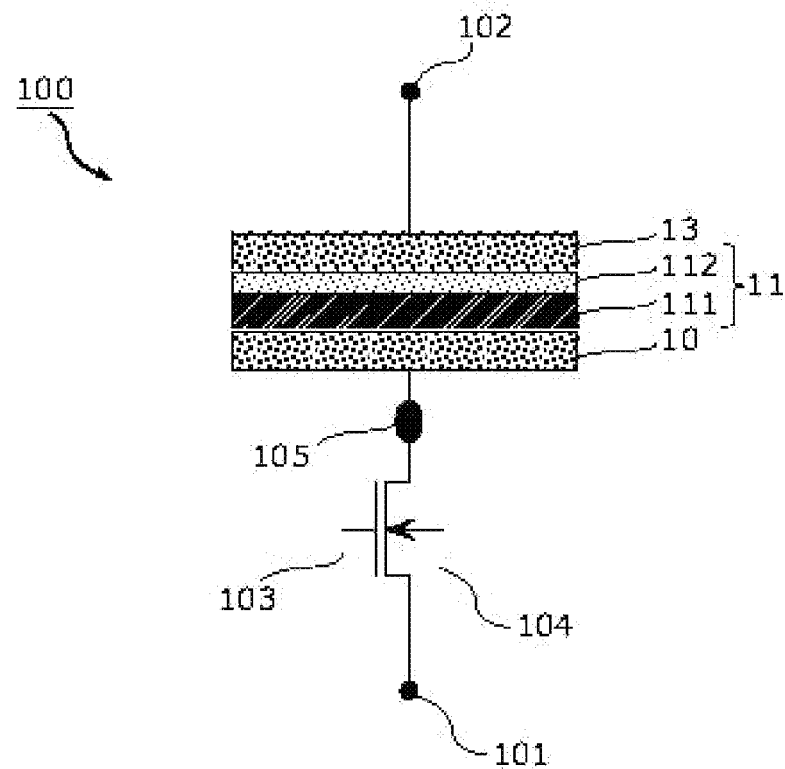
FIG. 1 is a schematic diagram showing a structure of a 1T1R memory cell using a variable resistance element according to the present invention.

FIG. 1 is a schematic diagram showing a structure (structure for one bit) of a 1T1R memory cell using a variable resistance element according to the present invention. The 1T1R memory cell is a memory cell in which a variable resistance nonvolatile memory element and a switching element are connected in series with each other. In detail, the 1T1R memory cell includes a variable resistance element 100 and a transistor 104, as shown in FIG. 1. An NMOS transistor is typically used as the transistor 104, but a PMOS transistor may be used instead.

The variable resistance element 100 is a variable resistance nonvolatile memory element according to the present invention, and includes: a first electrode (lower electrode 10), a second electrode (upper electrode 13), and a variable resistance layer 11 placed between the first electrode and the second electrode. The variable resistance layer 11 includes an oxygen-deficient first transition metal oxide layer 111 that is in contact with the first electrode (lower electrode 10), and a second transition metal oxide layer 112 that is in contact with the second electrode (upper electrode 13) and is lower in oxygen deficiency than the first transition metal oxide layer 111. The term "oxygen deficiency" means a proportion of oxygen short of an oxygen content of an oxide having a stoichiometric composition in each transition metal. Take tantalum (Ta) which is one type of transition metal as an example. $Ta_2O_5$ is an oxide having a stoichiometric composition, which can be expressed as $TaO_{2.5}$. Oxygen deficiency of $TaO_{2.5}$ is 0%. For instance, oxygen deficiency of oxygen-deficient tantalum oxide having a composition of $TaO_{1.5}$ is $(2.5-1.5)/2.5=40\%$.

In detail, the variable resistance element 100 is formed by stacking the first electrode (lower electrode 10), the variable resistance layer 11, and the second electrode (upper electrode 13), where the variable resistance layer 11 is formed by stacking the low-resistance first transition metal oxide layer 111 ($TaO_x$, $0<x<2.5$) comprising oxygen-deficient tantalum oxide and the high-resistance second transition metal oxide layer 112 ($TaO_y$, $x<y$), as shown in FIG. 1. That is, in this embodiment, the first transition metal oxide layer 111 comprises an oxygen-deficient first tantalum oxide layer, and the second transition metal oxide layer 112 comprises a second tantalum oxide layer. Preferably, the variable resistance layer 11 is formed by stacking the first transition metal oxide layer 111 ($TaO_x$, $0.8 \leq x \leq 1.9$) comprising oxygen-deficient tantalum oxide and the high-resistance second transition metal oxide layer 112 ($TaO_y$, $x<y$). The second transition metal oxide layer 112 is preferably 1 nm to 8 nm in film thickness. In the variable resistance element 100, a lower electrode terminal 105 is drawn from the lower electrode 10, and an upper electrode terminal 102 is drawn from the upper electrode 13.

The NMOS transistor 104 which is a selection transistor (i.e. an example of the switching element) includes a gate terminal 103. The lower electrode terminal 105 of the variable resistance element 100 and one of source and drain (N+ diffusion) regions of the NMOS transistor 104 are connected in series with each other. The other one of source and drain (N+ diffusion) regions of the NMOS transistor 104 not connected to the variable resistance element 100 is drawn as a lower electrode terminal 101, and a substrate terminal is connected to a ground potential.

In the variable resistance element 100, the second tantalum oxide layer (second transition metal oxide layer 112) is positioned on the upper electrode terminal 102 side opposite to the NMOS transistor 104.

The metal used in the transition metal oxide layer, i.e. the variable resistance layer 11, may be a transition metal other than tantalum. Examples of the transition metal include tantalum (Ta), titanium (Ti), hafnium (Hf), zirconium (Zr), niobium (Nb), and tungsten (W). Since the transition metal can assume a plurality of oxidation states, different resistance states can be realized by oxidation reduction reactions. As an example, in the case of using hafnium oxide, it has been confirmed that the resistance value of the variable resistance layer 11 can be changed stably at high speed when $0.9 \leq x \leq 1.6$ where $HfO_x$ is a composition of a first hafnium oxide layer which is the first transition metal oxide layer 111 and $x<y$ where $HfO_y$ is a composition of a second hafnium oxide layer which is the second transition metal oxide layer 112. Here, the second hafnium oxide layer which is the second transition metal oxide layer 112 is preferably 3 nm to 4 nm in film thickness. As another example, in the case of using zirconium oxide, it has been confirmed that the resistance value of the variable resistance layer 11 can be changed stably at high speed when $0.9 \leq x \leq 1.4$ where $ZrO_x$ is a composition of a first zirconium oxide layer which is the first transition metal oxide layer 111 and $x<y$ where $ZrO_y$ is a composition of a second zirconium oxide layer which is the second transition metal oxide layer 112. Here, the second zirconium oxide layer which is the second transition metal oxide layer 112 is preferably 1 nm to 5 nm in film thickness.

Moreover, different materials may be used as a first transition metal in the first transition metal oxide layer 111 and a second transition metal in the second transition metal oxide layer 112. In this case, the second transition metal oxide layer 112 preferably comprises a material that is lower in oxygen deficiency than the first transition metal oxide layer 111, i.e.

higher in resistance than the first transition metal oxide layer 111. According to this structure, a voltage applied across the first electrode (lower electrode 10) and the second electrode (upper electrode 13) for a resistance change is distributed more to the second transition metal oxide layer 112, which can increase a likelihood that an oxidation reduction reaction occurs in the second transition metal oxide layer 112. In the case of using different materials as the first transition metal and the second transition metal, it is preferable that the second transition metal has a lower standard electrode potential than the first transition metal. This is because a resistance change phenomenon is believed to take place in a manner that an oxidation reduction reaction which occurs in a small conductive path (filament) formed in the high-resistance second transition metal oxide layer 112 causes a change in resistance value. For example, the use of oxygen-deficient tantalum oxide in the first transition metal oxide layer 111 and $TiO_2$ in the second transition metal oxide layer 112 enables a stable resistance change operation. Titanium (standard electrode potential=−1.63 eV) is a material that is lower in standard electrode potential than tantalum (standard electrode potential=−0.6 eV). A higher standard electrode potential facilitates less oxidation. Therefore, by providing, in the second transition metal oxide layer 112, an oxide of a metal having a lower standard electrode potential than the first transition metal oxide layer 111, a likelihood of an oxidation reduction reaction occurring in the second transition metal oxide layer 112 can be increased.

Examples of a material of the upper electrode 13 include platinum (Pt), iridium (Ir), palladium (Pd), silver (Ag), nickel (Ni), tungsten (W), and copper (Cu). It is particularly desirable that Pt or Ir having a high standard electrode potential is used as the material of the upper electrode 13 in contact with the second transition metal oxide layer lower in oxygen deficiency than the first transition metal oxide layer, as a favorable resistance change operation is attained. This is because the standard electrode potential is one index of oxidizability, and a higher standard electrode potential facilitates less oxidation while a lower standard electrode potential facilitates more oxidation. That is, a resistance change is more likely to occur near the interface between the variable resistance layer and the electrode material having a higher standard electrode potential than Ta which is the constituent element of the variable resistance layer 11. Conversely, a resistance change is less likely to occur near the interface between the variable resistance layer and the electrode material having a lower standard electrode potential than Ta. This is because a resistance change is more likely to occur when there is a larger difference in standard electrode potential between the electrode material and the metal constituting the variable resistance layer, and the resistance change likelihood decreases as the difference decreases.

In the memory cell shown in FIG. 1, when a voltage (voltage pulse for low resistance writing) of an amplitude equal to or more than a predetermined voltage (e.g. first threshold voltage (for low resistance writing)) is applied to the lower electrode terminal 101 with respect to the upper electrode terminal 102, reduction occurs near the interface of the upper electrode 13, as a result of which the variable resistance element 100 changes to the low resistance state. When a voltage (voltage pulse for high resistance writing) of an amplitude equal to or more than another predetermined voltage (e.g. second threshold voltage (for high resistance writing)) is applied to the upper electrode terminal 102 with respect to the lower electrode terminal 101, oxidation occurs near the interface of the upper electrode 13, as a result of which the variable resistance element 100 changes to the high resistance state. Hereafter, an application direction of the voltage pulse for low resistance writing is defined as a negative voltage direction, and an application direction of the voltage pulse for high resistance writing as a positive voltage direction.

In other words, the variable resistance element 100 has characteristics of changing to the first resistance state when, with respect to one of the first electrode (lower electrode 10) and the second electrode (upper electrode 13), a first voltage pulse having a positive potential and equal to or more than a first threshold voltage is applied to an other one of the first electrode (lower electrode 10) and the second electrode (upper electrode 13), and changing to the second resistance state when, with respect to the other one of the first electrode and the second electrode, a second voltage pulse having a positive potential and equal to or more than a second threshold voltage is applied to the one of the first electrode and the second electrode. Here, the first electrode and the second electrode each correspond to a different one of the upper electrode 13 and the lower electrode 10 of the variable resistance element 100. For example, the first transition metal oxide layer 111 is the first tantalum oxide layer, and the second transition metal oxide layer 112 is the second tantalum oxide layer.

The following describes a method of writing the variable resistance nonvolatile memory element having the above-mentioned structure according to the present invention.

First, rewrite tolerance (endurance) characteristics when writing the 1T1R memory cell shown in FIG. 1 by a conventional writing method are described to examine its problem, with reference to FIGS. 2A to 6B.

It is assumed here that the upper electrode 13 comprises iridium (Ir), and the lower electrode 10 comprises tantalum nitride (TaN). It is also assumed that the variable resistance layer 11 includes the first tantalum oxide layer ($TaO_x$, $0<x<2.5$) and the second tantalum oxide layer ($TaO_y$, $x<y$).

The following variable resistance element 100 is used in an experiment to show the rewrite tolerance (endurance) characteristics when writing by the conventional writing method. The variable resistance layer 11 has an area of 0.25 μm² (=0.5 μm×0.5 μm). The first tantalum oxide layer in contact with the lower electrode 10 is $TaO_{1.54}$ and has a film thickness of 30 nm, and the second tantalum oxide layer in contact with the upper electrode 13 is $TaO_{2.47}$ and has a film thickness of 6 nm. The NMOS transistor which is the switching element has a gate width W of 0.44 μm, a gate length L of 0.18 μm, and a gate insulating film thickness Tox of 3.5 nm.

The second tantalum oxide layer ($TaO_{2.47}$) is formed by sputtering on the first tantalum oxide layer ($TaO_{1.54}$) formed by sputtering, before a step of forming the upper electrode 13. The second tantalum oxide layer ($TaO_{2.47}$) is lower in oxygen deficiency than the first tantalum oxide layer ($TaO_{1.54}$), i.e. has a structure of a very high resistance value (>1 MΩ). In order to initiate a resistance change operation, first a predetermined initial breakdown voltage needs to be applied for a predetermined time to form a conductive path in the second tantalum oxide layer. The resistance change phenomenon of the variable resistance element is believed to occur when this conductive path changes to the high resistance state or the low resistance state.

Figure 2A:
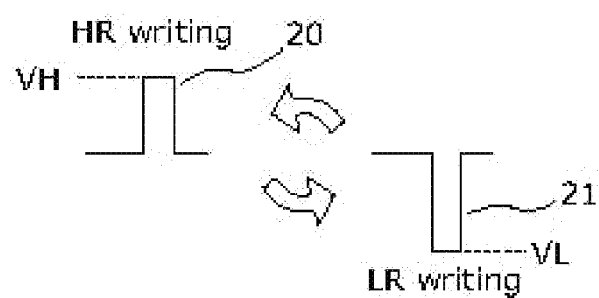
FIG. 2A is a schematic diagram showing a pulse waveform in the case where application of a voltage pulse for high resistance (HR) writing (one pulse) and application of a voltage pulse for low resistance (LR) writing (one pulse) are alternately performed.
Figure 2B:
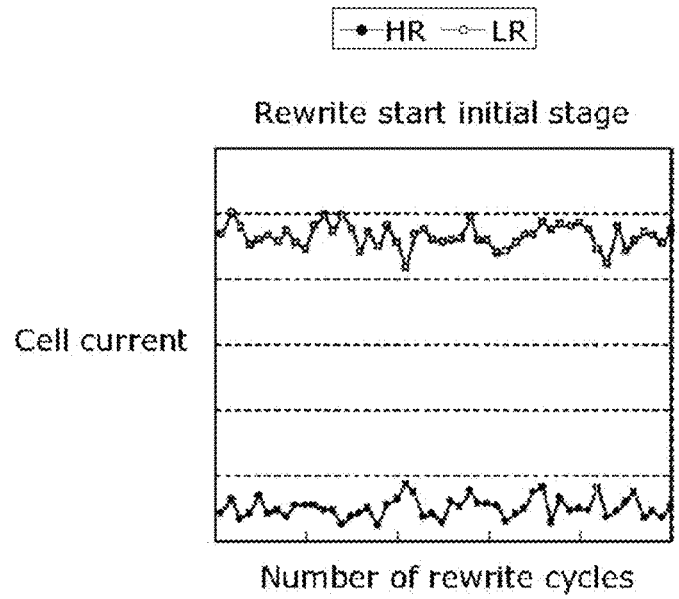
FIG. 2B is a rewrite characteristic diagram in a rewrite start initial stage in the case where the voltage pulse for high resistance writing and the voltage pulse for low resistance writing shown in FIG. 2A are alternately applied.
Figure 2C:
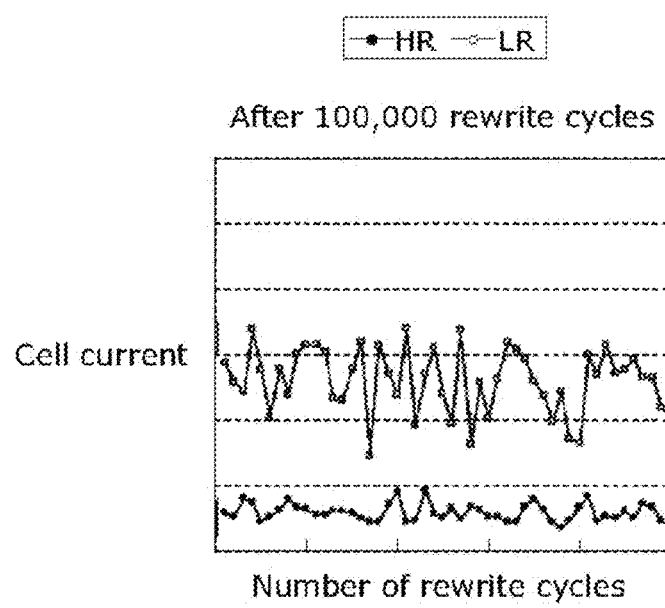
FIG. 2C is a rewrite characteristic diagram after 100,000 rewrite cycles in the case where the voltage pulse for high resistance writing and the voltage pulse for low resistance writing shown in FIG. 2A are alternately applied.

FIG. 2A is a schematic diagram showing a pulse waveform in the case where application of a voltage pulse (VH) for high resistance writing and application of a voltage pulse (VL) for low resistance writing are alternately performed across the terminals 101 and 102 in FIG. 1. FIG. 2B is a rewrite characteristic diagram in a rewrite start initial stage in the case where the voltage pulse for high resistance writing and the voltage pulse for low resistance writing shown in FIG. 2A are alternately applied. FIG. 2C is a rewrite characteristic diagram after 100,000 rewrite cycles in the case where the voltage pulse for high resistance writing and the voltage pulse for low resistance writing shown in FIG. 2A are alternately applied.

That is, FIG. 2A shows a conventional writing method applied to the 1T1R memory cell using the variable resistance element shown in FIG. 1. FIGS. 2B and 2C respectively show examples of rewrite characteristics in a rewrite initial state and a state after 100,000 rewrite cycles in the conventional writing method shown in FIG. 2A, i.e. in the case where a voltage pulse 20 (VH in FIG. 2A) for high resistance writing and a voltage pulse 21 (VL in FIG. 2A) for low resistance writing are alternately applied to the terminal 102 with respect to the terminal 101 repeatedly. Here, |VL|>|VH| for the following reason. In FIG. 1, in high resistance writing, a positive voltage is applied to the terminal 102 with respect to the terminal 101, so that the NMOS transistor 104 is in a low ON resistance state. In low resistance writing, on the other hand, a negative voltage is applied to the terminal 102 with respect to the terminal 101, so that the NMOS transistor 104 is source-follower connected and is in a high ON resistance state. Hence, an absolute value of a voltage actually applied to the variable resistance layer 11 is higher in high resistance writing than in low resistance writing. In FIGS. 2B and 2C, the vertical axis represents a cell current [A.U] in the high resistance (HR) state and the low resistance (LR) state when, in the memory cell shown in FIG. 1, a gate voltage VG sufficient to turn on the transistor is applied to the gate terminal 103 and a read voltage that does not cause a resistance change is applied to the upper electrode terminal 102 (while applying the ground potential to the lower electrode terminal 101). The vertical axis in each of FIGS. 2B and 2C has the same range. The horizontal axis represents the number of rewrite cycles.

FIGS. 2B and 2C show rewrite characteristics in the case where a voltage of VH is applied with a predetermined pulse width (e.g. 10 ns to 100 μs) as the voltage pulse 20 for high resistance (HR) writing and a voltage of VL is applied with a predetermined pulse width as the voltage pulse 21 for low resistance (LR) writing (while a gate voltage VG' sufficient to turn on the transistor is applied to the gate terminal 103).

As shown in FIG. 2B, in the rewrite start initial stage, the cell current in each of the high resistance (HR) state and the low resistance (LR) state is relatively stable. As shown in FIG. 2C, however, after 100,000 rewrite cycles, though the cell current in the high resistance (HR) state maintains a relatively stable state, the cell current in the low resistance (LR) state shifts to the high resistance direction and becomes unstable, as a result of which an operating window (difference between the cell current in the high resistance (HR) state and the cell current in the low resistance (LR) state) is significantly reduced. This raises a possibility of a reading error.

The reason that the cell current in the low resistance state shifts to the high resistance direction as the number of rewrite cycles increases is believed to be as follows. There is poor rewrite voltage balance between the voltage VH for high resistance writing and the voltage VL for low resistance writing, and the voltage VH for high resistance writing in FIG. 2A is slightly higher than an optimum voltage for high resistance writing (causing an excessive high resistance state). Therefore, the low resistance state cannot be sufficiently achieved even when the voltage VL for low resistance writing is applied.

Figure 3:
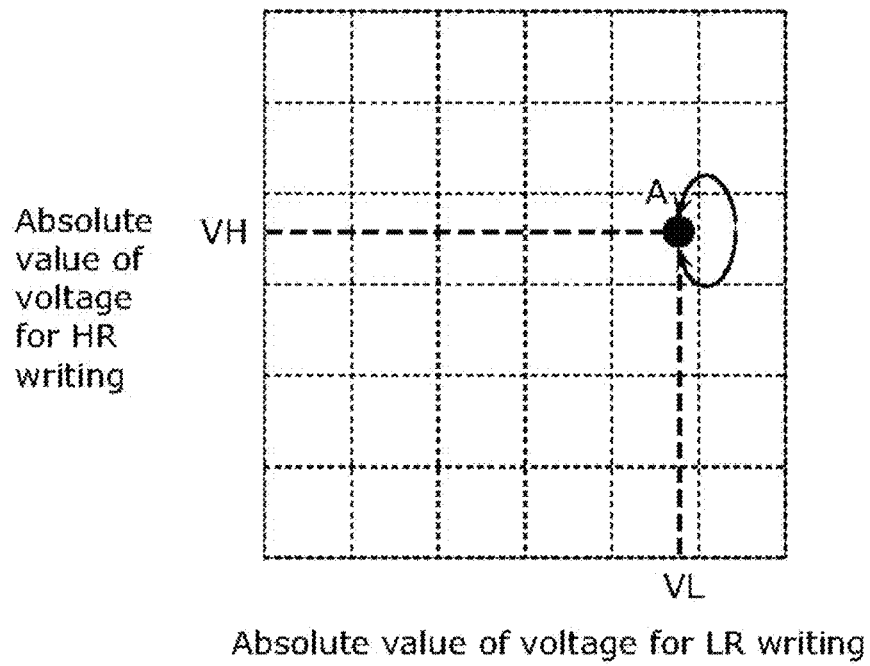
FIG. 3 is a diagram showing an operating point of a rewrite voltage in the case where the voltage pulse for high resistance (HR) writing and the voltage pulse for low resistance (LR) writing shown in FIG. 2A are alternately applied repeatedly.

FIG. 3 is a diagram showing an operating point of a rewrite voltage in the case where the voltage pulse 20 for high resistance (HR) writing and the voltage pulse 21 for low resistance (LR) writing shown in FIG. 2A are alternately applied repeatedly.

In FIG. 3, the horizontal axis represents the absolute value [V] of the voltage VL for LR writing, and the vertical axis represents the absolute value [V] of the voltage VH for HR writing. In FIG. 3, a point A represents an operating point in the case where the voltage pulse 20 for high resistance (HR) writing and the voltage pulse 21 for low resistance (LR) writing are alternately applied repeatedly.

Thus, in the case where the voltage pulse 20 for high resistance (HR) writing and the voltage pulse 21 for low resistance (LR) writing are each applied in one pulse, balance control between the voltage for high resistance writing and the voltage for low resistance writing is performed at one point (point A). Accordingly, even though the balance between the HR state and the LR state can be attained in the rewrite initial stage (FIG. 2B), as the number of rewrite cycles increases it becomes impossible to sufficiently change the variable resistance element to the LR state despite an attempt to change it from the HR state to the LR state, due to a magnitude relationship between the HR writing capability and the LR writing capability (here, HR writing capability >LR writing capability) (FIG. 2C).

The following describes rewrite tolerance (endurance) characteristics in the case where the voltage VH for high resistance writing is decreased to VH1 (|VH|>|VH1|).

Figure 4A:
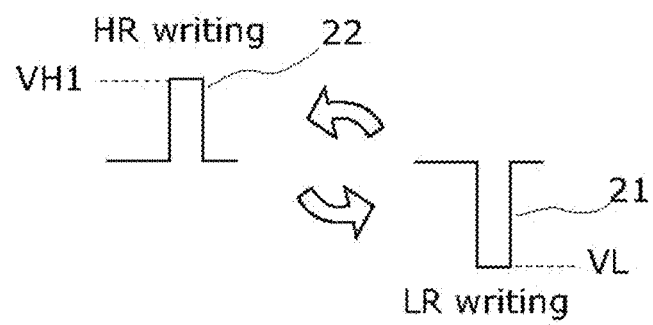
FIG. 4A is a schematic diagram showing another pulse waveform in the case where application of a voltage pulse for high resistance (HR) writing (one pulse) and application of a voltage pulse for low resistance (LR) writing (one pulse) are alternately performed.
Figure 4B:
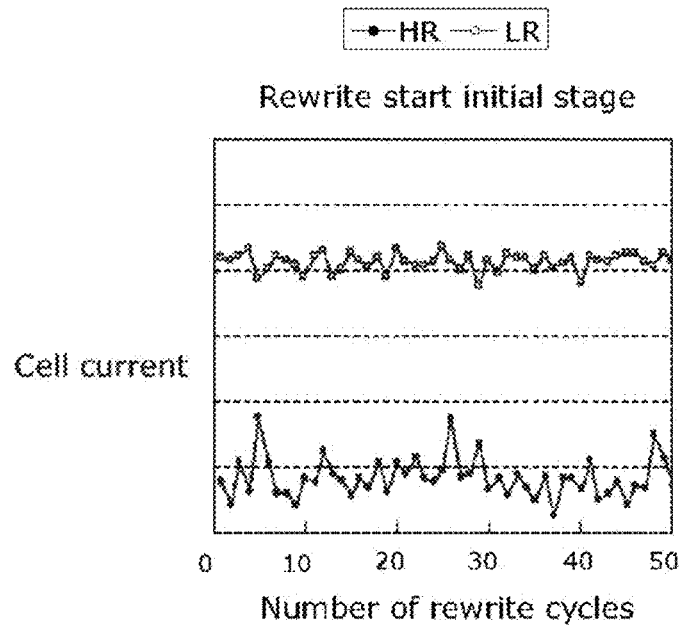
FIG. 4B is a rewrite characteristic diagram in a rewrite start initial stage in the case where the voltage pulse for high resistance writing and the voltage pulse for low resistance writing shown in FIG. 4A are alternately applied.
Figure 4C:
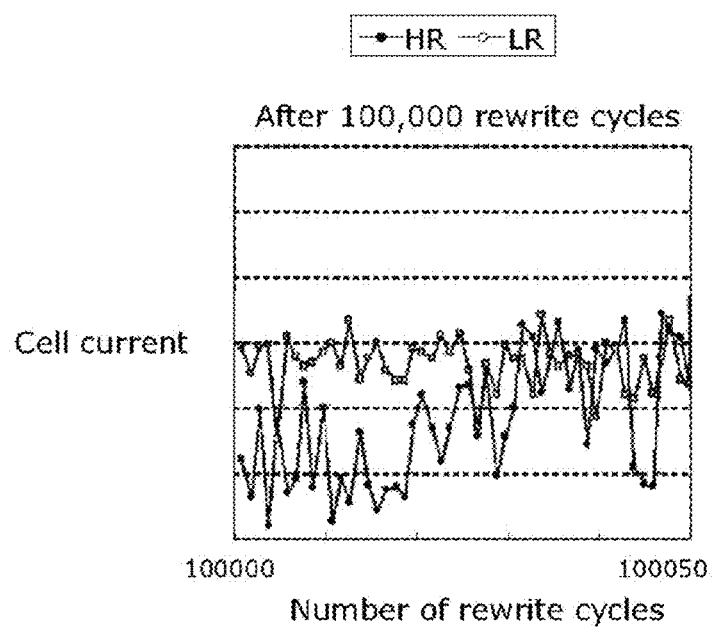
FIG. 4C is a rewrite characteristic diagram after 100,000 rewrite cycles in the case where the voltage pulse for high resistance writing and the voltage pulse for low resistance writing shown in FIG. 4A are alternately applied.

FIG. 4A is a schematic diagram showing a pulse waveform in the case where application of a voltage pulse (VH1) for high resistance writing and application of a voltage pulse (VL) for low resistance writing are alternately performed. FIG. 4B is a rewrite characteristic diagram in a rewrite start initial stage in the case where the voltage pulse for high resistance writing and the voltage pulse for low resistance writing shown in FIG. 4A are alternately applied. FIG. 4C is a rewrite characteristic diagram after 100,000 rewrite cycles in the case where the voltage pulse for high resistance writing and the voltage pulse for low resistance writing shown in FIG. 4A are alternately applied.

That is, FIG. 4A shows a conventional writing method applied to the 1T1R memory cell using the variable resistance element shown in FIG. 1 in the case where the voltage for high resistance writing is VH1 (<VH) and the voltage for low resistance writing is VL. FIGS. 4B and 4C respectively show examples of rewrite characteristics in a rewrite initial state and a state after 100,000 rewrite cycles in the conventional writing method shown in FIG. 4A, i.e. in the case where a voltage pulse 22 (VH1 in FIG. 4A) for high resistance writing and the voltage pulse 21 (VL in FIG. 4A) for low resistance writing shown in FIG. 4A are alternately applied repeatedly. The vertical axis and the horizontal axis in FIGS. 4B and 4C are the same as those in FIGS. 2B and 2C, and so their description is omitted.

FIGS. 4B and 4C show rewrite characteristics in the case where a voltage of VH1 is applied with a predetermined pulse width as the voltage pulse 22 for high resistance writing and a voltage of VL is applied with a predetermined pulse width as the voltage pulse 21 for low resistance writing (while the gate voltage VG' sufficient to turn on the transistor is applied to the gate terminal 103).

As shown in FIG. 4B, in the rewrite start initial stage, the cell current in each of the high resistance (HR) state and the low resistance (LR) state is relatively stable. As shown in FIG. 4C, however, after 100,000 rewrite cycles, the cell current in the high resistance (HR) state shifts to the low resistance direction and becomes extremely unstable, as a result of which the operating window disappears (the cell current in the high resistance state and the cell current in the low resistance state intersect with each other).

The reason that the cell current in the high resistance state shifts to the low resistance direction as the number of rewrite cycles increases is believed to be as follows. There is poor rewrite voltage balance between the voltage VH1 for high resistance writing and the voltage VL for low resistance writing, and the voltage VL for low resistance writing in FIG. 4A is slightly higher in absolute value than an optimum voltage for low resistance writing (causing an excessive low resistance state). Therefore, the high resistance state cannot be sufficiently achieved even when the voltage VH1 for high resistance writing is applied.

As mentioned above, in the case where the voltage pulse for high resistance (HR) writing and the voltage pulse for low resistance (LR) writing are each applied in one pulse, balance control between the voltage for high resistance writing and the voltage for low resistance writing is performed at one point, as shown in FIG. 3. Accordingly, even though the balance between the HR state and the LR state is relatively good in the rewrite initial stage, as the number of rewrite cycles increases one of the LR state and the HR state becomes stronger due to the subtle magnitude relationship between the HR writing capability and the LR writing capability, and it becomes impossible to sufficiently change the variable resistance element to the other state despite an attempt to change it to the other state. It is extremely difficult to uniquely specify an appropriate combination of the voltage VH for high resistance writing and the voltage VH for low resistance writing for all cycles.

In other words, when the voltage pulse for high resistance writing (once) and the voltage pulse for low resistance writing (once) are alternately applied to the memory cell using the variable resistance element 100 described above, a relatively stable resistance change operation is attained in the rewrite initial stage. As the number of rewrite cycles increases, however, a resistance value RL in the low resistance state increases or a resistance value RH in the high resistance state decreases, depending on the balance between the voltage VH for high resistance writing and the voltage VL for low resistance writing. Thus, the conventional writing method has the problem that the operating window is reduced as the number of rewrite cycles increases.

In view of such circumstances, the present inventors have studied a new variable resistance nonvolatile memory element writing method. The new writing method is, for example, such a method that applies a plurality of pulses in high resistance writing so as to shift the cell current more to the high resistance direction each time high resistance writing is performed, and equally applies a plurality of pulses in low resistance writing so as to shift the cell current more to the low resistance direction each time low resistance writing is performed. According to the new writing method, even when the number of rewrite cycles increases, the operating window is kept from deterioration, so that improved endurance (rewrite tolerance) can be attained. This is described below.

Basic data relating to several writing methods is described first.

(1) When a Voltage Pulse for High Resistance Writing is Successively Applied

Figure 5A:
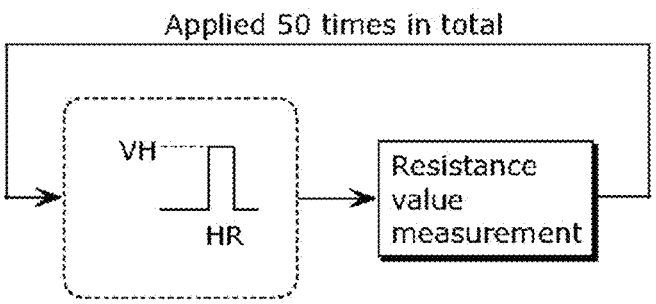
FIG. 5A is a diagram showing a resistance value measurement flow in the case of successively applying a voltage pulse for high resistance (HR) writing according to the present invention.
Figure 5B:
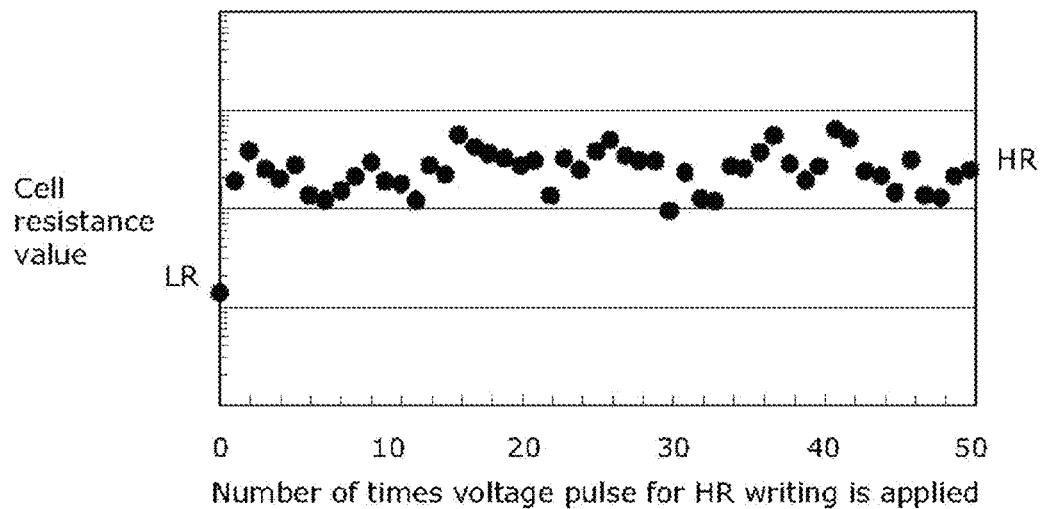
FIG. 5B is a resistance change characteristic diagram as a result of measurement based on the measurement flow shown in FIG. 5A.

FIG. 5A is a diagram showing a resistance value measurement flow in the case of successively applying a voltage pulse for high resistance (HR) writing to the variable resistance element in the low resistance (LR) state according to the present invention. FIG. 5B is a resistance change characteristic diagram as a result of measurement based on the measurement flow shown in FIG. 5A. In FIG. 5B, the horizontal axis represents the number of times the voltage pulse for HR writing is applied, and the vertical axis represents the resistance value of the memory cell shown in FIG. 1.

The measurement flow shown in FIG. 5A is as follows. First, in the 1T1R memory cell using the variable resistance element shown in FIG. 1, the gate voltage VG' sufficient to turn on the transistor is applied to the gate terminal 103, and the voltage pulse for high resistance (HR) writing (with an amplitude of VH and a predetermined pulse width) is applied once to the memory cell in the low resistance state (hereafter referred to as "high resistance writing voltage pulse application"). Next, the resistance value is calculated from the cell current in the high resistance (HR) state when the gate voltage VG (<VG') is applied to the gate terminal 103 of the transistor and the read voltage is applied to the upper electrode terminal 102 (while applying the ground potential to the lower electrode terminal 101) (hereafter referred to as "resistance value measurement"). Subsequently, the high resistance writing voltage pulse application and the resistance value measurement are repeated until the total number of times the high resistance writing voltage pulse application and the resistance value measurement are performed reaches 50.

As can be understood from FIG. 5B, the memory cell shown in FIG. 1 has characteristics that the high resistance level does not increase monotonously or decrease monotonously even when the same voltage pulse for high resistance writing is applied a plurality of times cumulatively. On the other hand, a nonvolatile memory cell such as a flash memory has characteristics that a threshold voltage of a cell transistor increases monotonously or decreases monotonously when a voltage pulse which is one of a write pulse and an erase pulse is successively applied.

(2) When a Voltage Pulse for Low Resistance Writing is Successively Applied

Figure 6A:
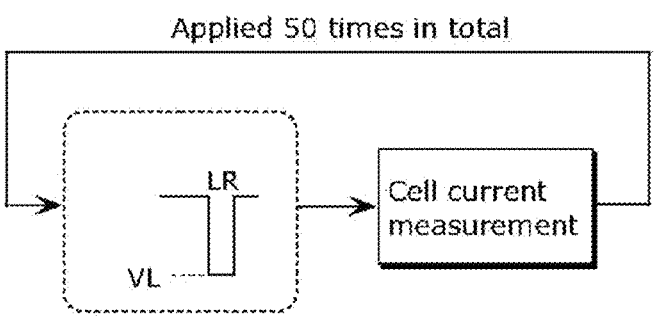
FIG. 6A is a diagram showing a cell current measurement flow in the case of successively applying a voltage pulse for low resistance (LR) writing according to the present invention.
Figure 6B:
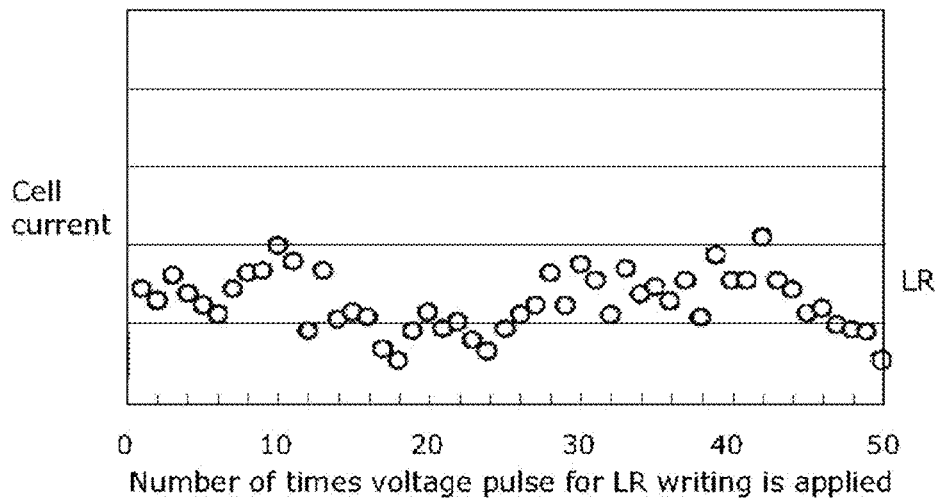
FIG. 6B is a cell current change characteristic diagram as a result of measurement based on the measurement flow shown in FIG. 6A.

FIG. 6A is a diagram showing a cell current measurement flow in the case of successively applying a voltage pulse for low resistance (LR) writing according to the present invention. FIG. 6B is a resistance change characteristic diagram as a result of measurement based on the measurement flow shown in FIG. 6A. In FIG. 6B, the horizontal axis represents the number of times the voltage pulse for LR writing is applied, and the vertical axis represents the cell current of the memory cell shown in FIG. 1.

The measurement flow shown in FIG. 6A is as follows. First, in the 1T1R memory cell using the variable resistance element shown in FIG. 1, the gate voltage VG' sufficient to turn on the transistor is applied to the gate terminal 103, and the voltage pulse for low resistance (LR) writing (with an amplitude of VL and a predetermined pulse width) is applied once to the memory cell in the high resistance state (hereafter referred to as "low resistance writing voltage pulse application"). Next, the cell current in the low resistance (LR) state when the gate voltage VG sufficient to turn on the transistor is applied to the gate terminal 103 and the read voltage is applied to the upper electrode terminal 102 (while applying the ground potential to the lower electrode terminal 101) is measured (hereafter referred to as "cell current measurement"). Subsequently, the low resistance writing voltage pulse application and the cell current measurement are repeated until the total number of times the low resistance writing voltage pulse application and the cell current measurement are performed reaches 50.

As can be understood from FIG. 6B, the memory cell shown in FIG. 1 has characteristics that the cell current in LR writing does not increase monotonously or decrease monotonously even when the same voltage pulse for low resistance writing is applied a plurality of times cumulatively, as in the case where the voltage pulse for high resistance writing is successively applied.

Figure 7A:
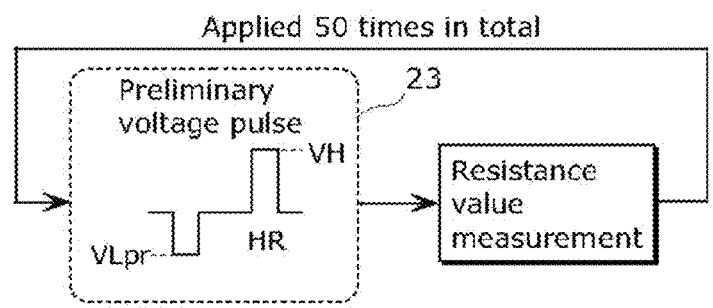
FIG. 7A is a diagram showing a resistance value measurement flow in the case of successively applying a voltage pulse set for high resistance (HR) writing according to the present invention.
Figure 7B:
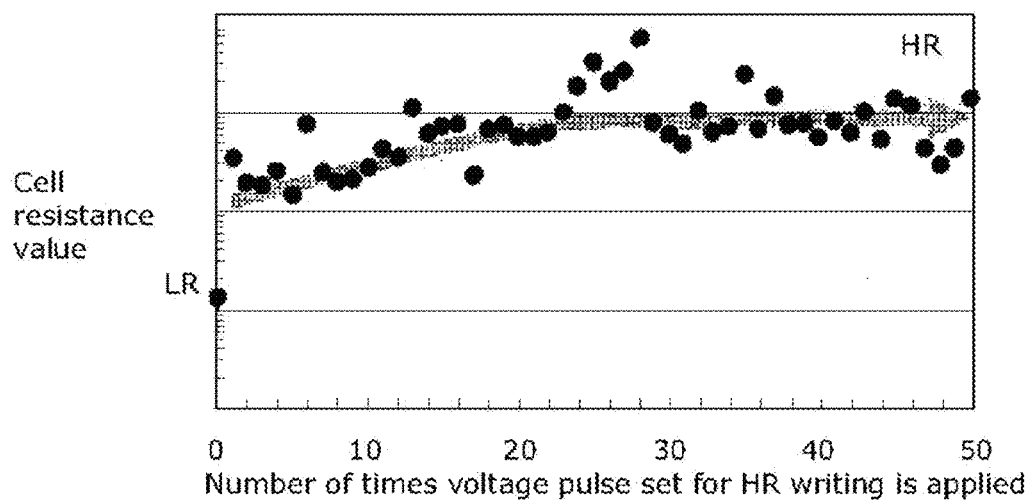
FIG. 7B is a resistance change characteristic diagram as a result of measurement based on the resistance value measurement flow shown in FIG. 7A.

(3) When a High Resistance Writing Operation of Applying a Voltage Pulse Set for High Resistance Writing is Performed a Plurality of Times According to Embodiment 1 of the Present Invention FIG. 7A is a diagram showing a resistance value measurement flow in the case of successively performing application of a voltage pulse set for high resistance writing (application of a preliminary voltage pulse VLpr of a polarity in the low resistance direction before the voltage pulse VH for high resistance writing) according to Embodiment 1 of the present invention. FIG. 7B is a cell current change characteristic diagram as a result of measurement based on the resistance value measurement flow shown in FIG. 7A. In FIG. 7B, the horizontal axis represents the number of times a voltage pulse set 23 for high resistance writing is applied, and the vertical axis represents the resistance value of the memory cell shown in FIG. 1.

The resistance value measurement flow shown in FIG. 7A is as follows. First, in the 1T1R memory cell using the variable resistance element shown in FIG. 1, the gate voltage VG' sufficient to turn on the transistor is applied to the gate terminal 103, and the preliminary voltage pulse VLpr for high resistance writing that has the polarity in the low resistance direction and has a smaller amplitude than a threshold voltage for low resistance writing is applied and subsequently the voltage pulse VH for high resistance (HR) writing with a predetermined pulse width (e.g. 100 ns) is applied to the memory cell in the low resistance state (hereafter referred to as "application of the high resistance writing voltage pulse set 23"). Next, the resistance value is calculated from the cell current in the high resistance (HR) state when the gate voltage VG sufficient to turn on the transistor is applied to the gate terminal 103 and the read voltage is applied to the upper electrode terminal 102 (while applying the ground potential to the lower electrode terminal 101) (hereafter referred to as "resistance value measurement"). Subsequently, the application of the high resistance writing voltage pulse set 23 and the resistance value measurement are repeated until the total number of times the application of the high resistance writing voltage pulse set and the resistance value measurement are performed reaches 50.

As can be understood from FIG. 7B, when the application of the high resistance writing voltage pulse set 23 by applying the preliminary voltage pulse VLpr for high resistance writing (also referred to as "weak reverse voltage pulse for high resistance writing") that is opposite in polarity to the voltage pulse for high resistance writing and smaller in amplitude than the threshold voltage for low resistance writing and subsequently applying the voltage pulse VH for high resistance writing is repeatedly performed, the cell resistance value of the memory cell shown in FIG. 1 increases monotonously with the number of times the voltage pulse set 23 for high resistance writing is applied, and tends to be saturated when the number of times the voltage pulse set 23 for high resistance writing is applied reaches about 30. Thus, the present inventors have found conventionally-unknown new high resistance writing characteristics by employing the new writing method according to the present invention.

Figure 8A:
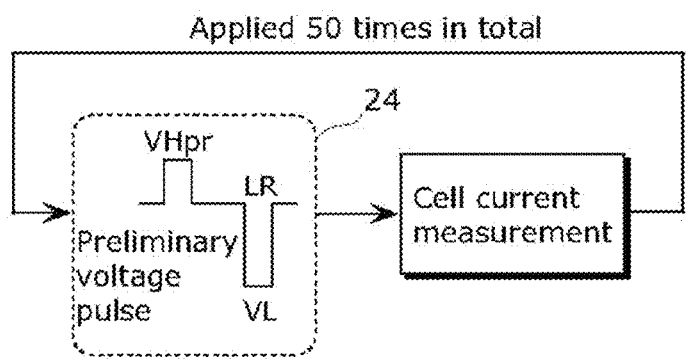
FIG. 8A is a diagram showing a cell current measurement flow in the case of successively applying a voltage pulse set for low resistance (LR) writing according to the present invention.
Figure 8B:
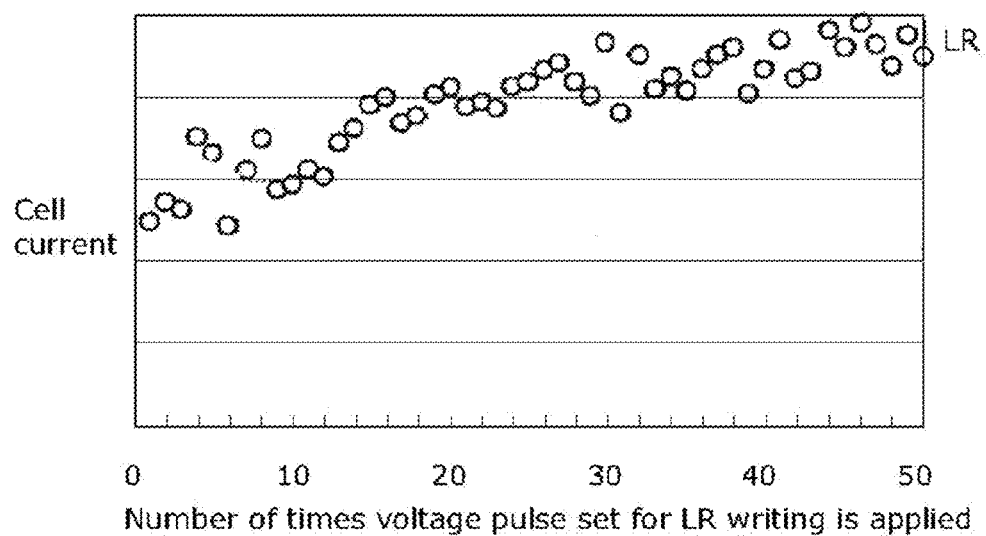
FIG. 8B is a cell current change characteristic diagram as a result of measurement based on the cell current measurement flow shown in FIG. 8A.

(4) When a Low Resistance Writing Operation of Applying a Voltage Pulse Set for Low Resistance Writing is Performed a Plurality of Times According to Embodiment 1 of the Present Invention FIG. 8A is a diagram showing a cell current measurement flow in the case of successively performing application of a voltage pulse set for low resistance writing (application of a preliminary voltage pulse VHpr of a polarity in the high resistance direction before the voltage pulse VL for low resistance writing) according to Embodiment 1 of the present invention. FIG. 8B is a cell current change characteristic diagram as a result of measurement based on the cell current measurement flow shown in FIG. 8A. In FIG. 8B, the horizontal axis represents the number of times a voltage pulse set 24 for low resistance writing is applied, and the vertical axis represents the cell current of the memory cell shown in FIG. 1.

The cell current measurement flow shown in FIG. 8A is as follows. First, in the 1T1R memory cell using the variable resistance element shown in FIG. 1, the gate voltage VG' sufficient to turn on the transistor is applied to the gate terminal 103, and the preliminary voltage pulse VHpr that has the polarity in the high resistance direction and has a smaller amplitude than a threshold voltage for high resistance writing is applied and subsequently the voltage pulse VL for low resistance (LR) writing with a predetermined pulse width (e.g. 100 ns) is applied to the memory cell in the high resistance state (hereafter referred to as "application of the low resistance writing voltage pulse set 24"). Next, the cell current in the low resistance (LR) state when the gate voltage VG sufficient to turn on the transistor is applied to the gate terminal 103 and the read voltage is applied to the upper electrode terminal 102 (while applying the ground potential to the lower electrode terminal 101) is measured (hereafter referred to as "cell current measurement"). Subsequently, the application of the low resistance writing voltage pulse set 24 and the resistance value measurement are repeated until the total number of times the application of the low resistance writing voltage pulse set and the resistance value measurement are performed reaches 50.

As can be understood from FIG. 8B, when the application of the low resistance writing voltage pulse set 24 by applying the preliminary voltage pulse VHpr for low resistance writing (also referred to as "weak reverse voltage pulse for low resistance writing") that is opposite in polarity to the voltage pulse for low resistance writing and smaller in amplitude than the threshold voltage for high resistance writing and subsequently applying the voltage pulse VL for low resistance writing is repeatedly performed, the cell current of the memory cell shown in FIG. 1 increases monotonously (and the cell resistance decreases monotonously) with the number of times the voltage pulse set 24 for low resistance writing is applied. Thus, the present inventors have found conventionally-unknown new low resistance writing characteristics by employing the new writing method according to the present invention.

In detail, the present inventors have found the following. Even when the voltage pulse for high resistance writing of the same polarity is successively applied as shown in FIG. 5A and the voltage pulse for low resistance writing of the same polarity is successively applied as shown in FIG. 6, the high resistance level and the low resistance level are not improved. On the other hand, when the voltage pulse set in which the preliminary voltage pulse for high resistance writing or the preliminary voltage pulse for low resistance writing (the weak reverse voltage pulse for high resistance writing or the weak reverse voltage pulse for low resistance writing) is added before the normal voltage pulse for high resistance writing or voltage pulse for low resistance writing is repeatedly applied a plurality of times as shown in FIGS. 7A and 8A, the resistance value in high resistance writing increases more, and the resistance value in low resistance writing decreases more.

The following describes results of research on high resistance writing preliminary voltage pulse amplitude dependency of the convergence of the cell current in the high resistance state in the case of successively applying the voltage pulse set 23 for high resistance writing, and low resistance writing preliminary voltage pulse amplitude dependency of the convergence of the cell current in the low resistance state in the case of successively applying the voltage pulse set 24 for low resistance writing.

Figure 9:
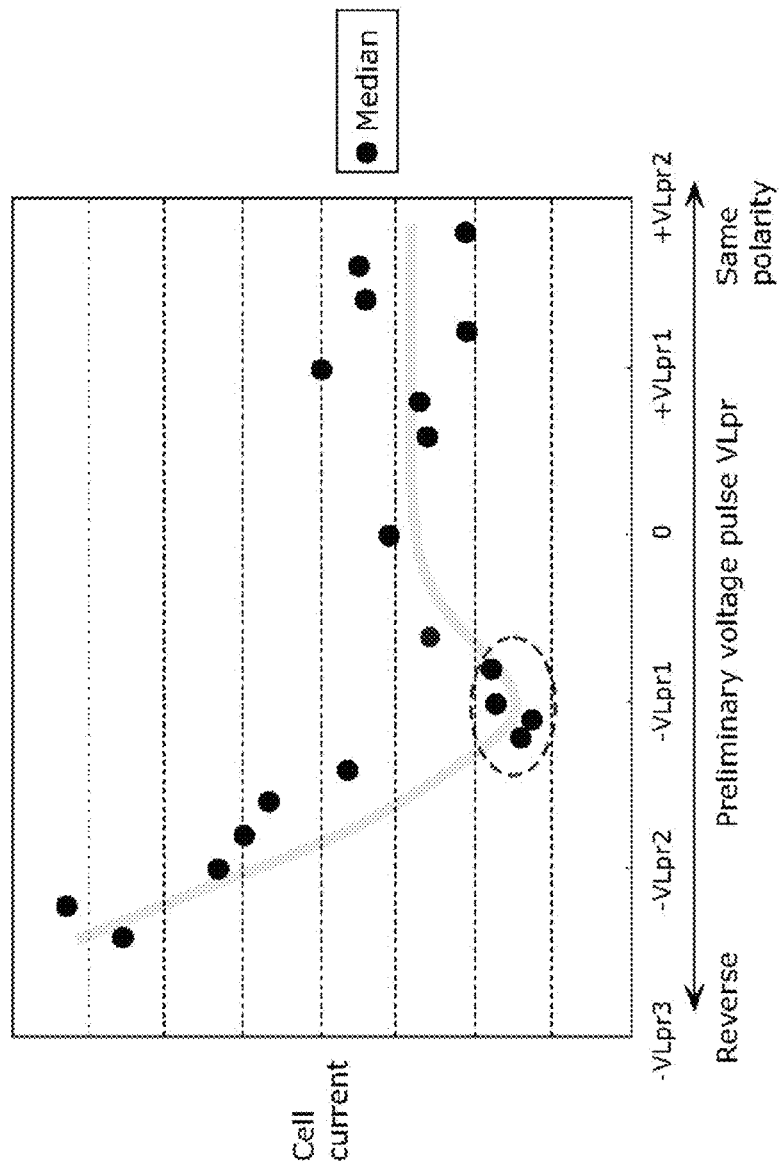
FIG. 9 is a characteristic diagram showing dependency of an HR cell current on a preliminary voltage pulse according to the present invention.

FIG. 9 is a characteristic diagram showing dependency of the HR cell current on the polarity and the amplitude of the preliminary voltage pulse for high resistance writing according to the present invention. In detail, FIG. 9 shows dependency of the HR cell current value in the voltage VH for high resistance writing, on the amplitude and the polarity of the preliminary voltage pulse VLpr for high resistance writing. In FIG. 9, the vertical axis and the horizontal axis respectively represent a median of the cell current value (HR cell current value) and a value of the preliminary voltage pulse VLpr for high resistance writing for the last 20 times when the resistance is measured 50 times in the measurement flow shown in FIG. 7A with the amplitude and the polarity of the high resistance preliminary voltage pulse VLpr as a parameter (−VLpr3 to +VLpr2).

As can be understood from FIG. 9, the HR cell current value in the dashed region is minimum (i.e. the resistance value in the HR state is maximum), and the HR cell current value increases in both the region where the preliminary voltage pulse for high resistance writing is more on the positive side than the dashed region and the region where the preliminary voltage pulse for high resistance writing is more on the negative side than the dashed region. The preliminary voltage pulse VLpr for high resistance writing in the dashed region, i.e. the preliminary voltage pulse VLpr for high resistance writing corresponding to the minimum value of the HR cell current value median, is hereafter referred to as a disturb voltage for high resistance writing.

When the preliminary voltage pulse VLpr for high resistance writing is the disturb voltage for high resistance writing, the HR cell current value median is minimum. This indicates that the disturb voltage for high resistance writing is an optimum high resistance writing preliminary voltage value VLpr. Hence, the HR writing capability can be effectively improved by applying the preliminary voltage pulse VLpr for high resistance writing corresponding to the disturb voltage for high resistance writing, namely, by applying a voltage (about −VLpr1 in FIG. 9) that is opposite in polarity to the pulse voltage VH for HR writing and smaller in absolute value than the threshold voltage for low resistance writing. As shown in FIG. 9, the optimum preliminary voltage pulse for high resistance writing has a certain range, and the disturb voltage for high resistance writing within this optimum preliminary voltage pulse range for high resistance writing is hereafter defined as "appropriate preliminary voltage pulse for HR writing".

Figure 10:
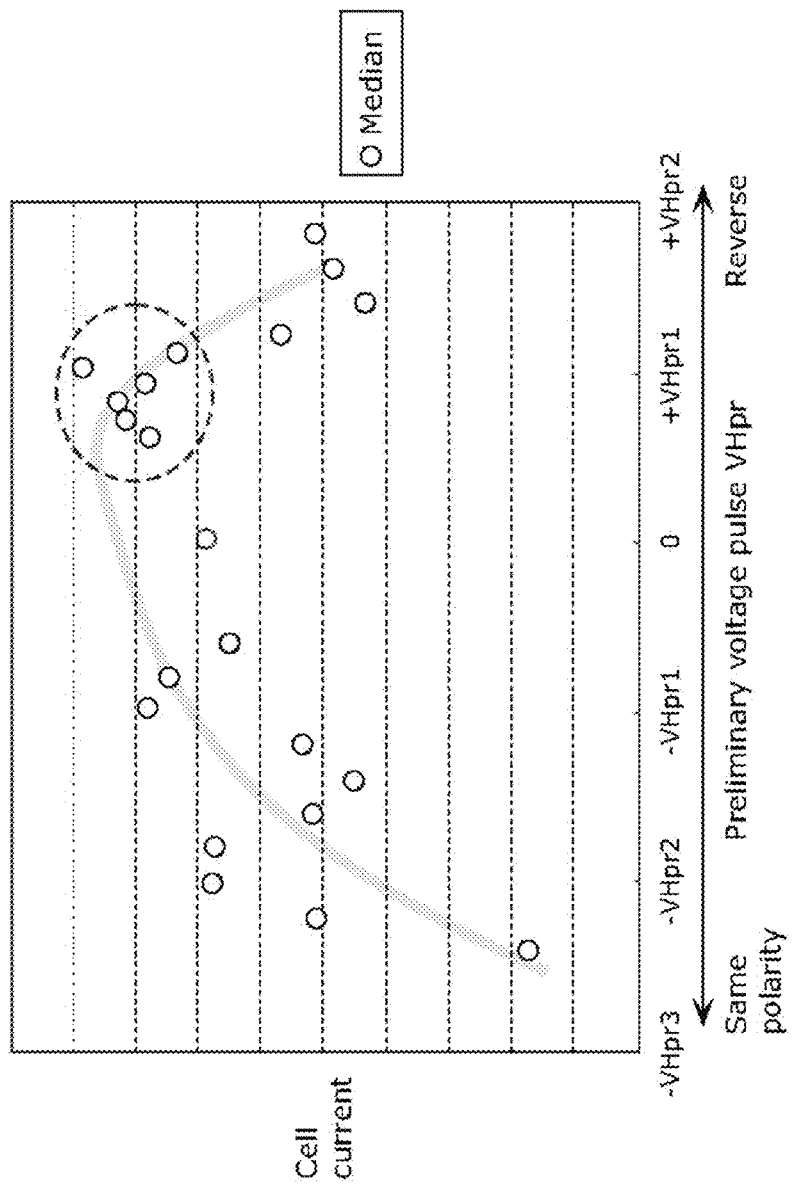
FIG. 10 is a characteristic diagram showing dependency of an LR cell current on a preliminary voltage pulse according to the present invention.

FIG. 10 is a characteristic diagram showing dependency of the LR cell current on the polarity and the amplitude of the preliminary voltage pulse for low resistance writing according to the present invention. In detail, FIG. 10 shows dependency of the LR cell current value in the voltage VL for low resistance writing, on the amplitude and the polarity of the preliminary voltage pulse VHpr for low resistance writing. In FIG. 10, the vertical axis and the horizontal axis respectively represent a median of the LR cell current value and a value of the preliminary voltage pulse VHpr for low resistance writing for the last 20 times when the cell current is measured 50 times in the measurement flow shown in FIG. 8A with the amplitude and the polarity of the low resistance preliminary voltage pulse VHpr as a parameter (−VHpr3 to +VHpr2).

As can be understood from FIG. 10, the LR cell current value in the dashed region is maximum (i.e. the resistance value in the LR state is minimum), and the LR cell current value decreases in both the region where the preliminary voltage pulse for low resistance writing is more on the positive side than the dashed region and the region where the preliminary voltage pulse for low resistance writing is more on the negative side than the dashed region. The preliminary voltage pulse VHpr for low resistance writing in the dashed region, i.e. the preliminary voltage pulse VHpr for low resistance writing corresponding to the maximum value of the LR cell current value median, is hereafter referred to as a disturb voltage for low resistance writing.

When the preliminary voltage pulse VHpr for low resistance writing is the disturb voltage for low resistance writing, the LR cell current value median is maximum. This indicates that the disturb voltage for low resistance writing is an optimum low resistance writing preliminary voltage value VHpr. Hence, the LR writing capability can be effectively improved by applying the preliminary voltage pulse VHpr for low resistance writing corresponding to the disturb voltage for low resistance writing, namely, by applying a voltage (about +VHpr1 in FIG. 10) that is opposite in polarity to the pulse voltage VL for LR writing and smaller in absolute value than the threshold voltage for high resistance writing. As shown in FIG. 10, the optimum preliminary voltage pulse for low resistance writing has a certain range, and the disturb voltage for low resistance writing within this optimum preliminary voltage pulse range for low resistance writing is hereafter defined as "appropriate preliminary voltage pulse for LR writing".

By applying the appropriate preliminary voltage pulse VLpr for high resistance writing (disturb voltage for high resistance writing) or preliminary voltage pulse VHpr for low resistance writing (disturb voltage for low resistance writing) before the voltage pulse VH for high resistance writing or the voltage pulse VL for low resistance writing, the HR writing capability of the pulse for high resistance writing and the LR writing capability of the pulse for low resistance writing can be enhanced without increasing the absolute value of the voltage VH for high resistance writing or the voltage VL for low resistance writing. This has an advantageous effect of expanding the operating window (difference between the HR cell current and the LR cell current) and thereby improving reliability.

The following describes relations between the pulse V-I characteristics in the memory cell shown in FIG. 1 and the appropriate preliminary voltage pulses in HR writing and LR writing.

Figure 11:
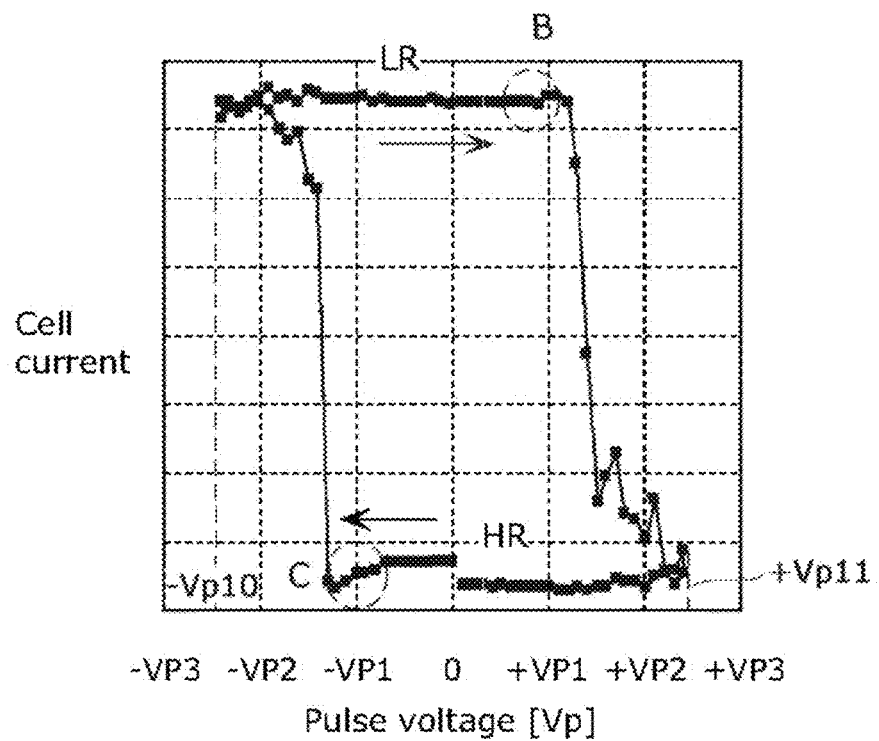
FIG. 11 is a diagram showing pulse V-I characteristics of a memory cell according to the present invention.

FIG. 11 is a pulse V-I characteristic diagram of the memory cell according to the present invention.

In FIG. 11, in the memory cell shown in FIG. 1, a pulse voltage Vp (horizontal axis) is applied while applying the gate voltage VG' sufficient to turn on the transistor to the gate terminal 103 and, each time the pulse voltage Vp is applied, the cell current (vertical axis) when the gate voltage VG sufficient to turn on the transistor is applied to the gate terminal 103 and the read voltage is applied to the upper electrode terminal 102 (while applying the ground potential to the lower electrode terminal 101) is measured. In FIG. 11, one cycle of a hysteresis loop is measured by applying the pulse voltage Vp in order of 0 V→−VP10→+VP11→0 V (each pulse voltage change is 0.1 V in absolute value).

As shown in FIG. 11, the change to the LR state starts at point C, and the change to the HR state starts at point B.

In FIG. 11, the appropriate preliminary voltage pulse in LR writing (disturb voltage for low resistance writing) is indicated by the dashed circle B', and the appropriate preliminary voltage pulse in HR writing (disturb voltage for high resistance writing) is indicated by the dashed circle C'. The appropriate preliminary voltage pulse in HR writing (disturb voltage for high resistance writing) is smaller than the threshold voltage for LR writing, and applied before the application of the voltage pulse for high resistance writing to cause the variable resistance element to change more to the high resistance state. The appropriate preliminary voltage pulse in LR writing (disturb voltage for low resistance writing) is smaller than the threshold voltage for HR writing, and applied before the application of the voltage pulse for low resistance writing to cause the variable resistance element to change more to the low resistance state. That is, the appropriate preliminary voltage pulse in HR writing is a weak voltage that does not cause a change from the HR state to the LR state, and the appropriate preliminary voltage pulse in LR writing is a weak voltage that does not cause a change from the LR state to the HR state. In other words, the disturb voltage for high resistance writing and the disturb voltage for low resistance writing are respectively close to the start voltage at which the change to the HR state starts and the start voltage at which the change to the LR state starts in the memory cell shown in FIG. 1. In more detail, it is more effective if the disturb voltage for high resistance writing and the disturb voltage for low resistance writing are each a voltage that is not sufficient to invert the resistance state of the memory cell shown in FIG. 1 but is closer to the voltage (start voltage) which causes the resistance change of the memory cell.

[Estimated Mechanism of Writing by Applying Preliminary Voltage Pulse for High Resistance Writing and Low Resistance Writing]

The following describes an estimated mechanism of a writing characteristic improvement by applying the preliminary voltage pulse for high resistance writing and the preliminary voltage pulse for low resistance writing.

Figure 12:
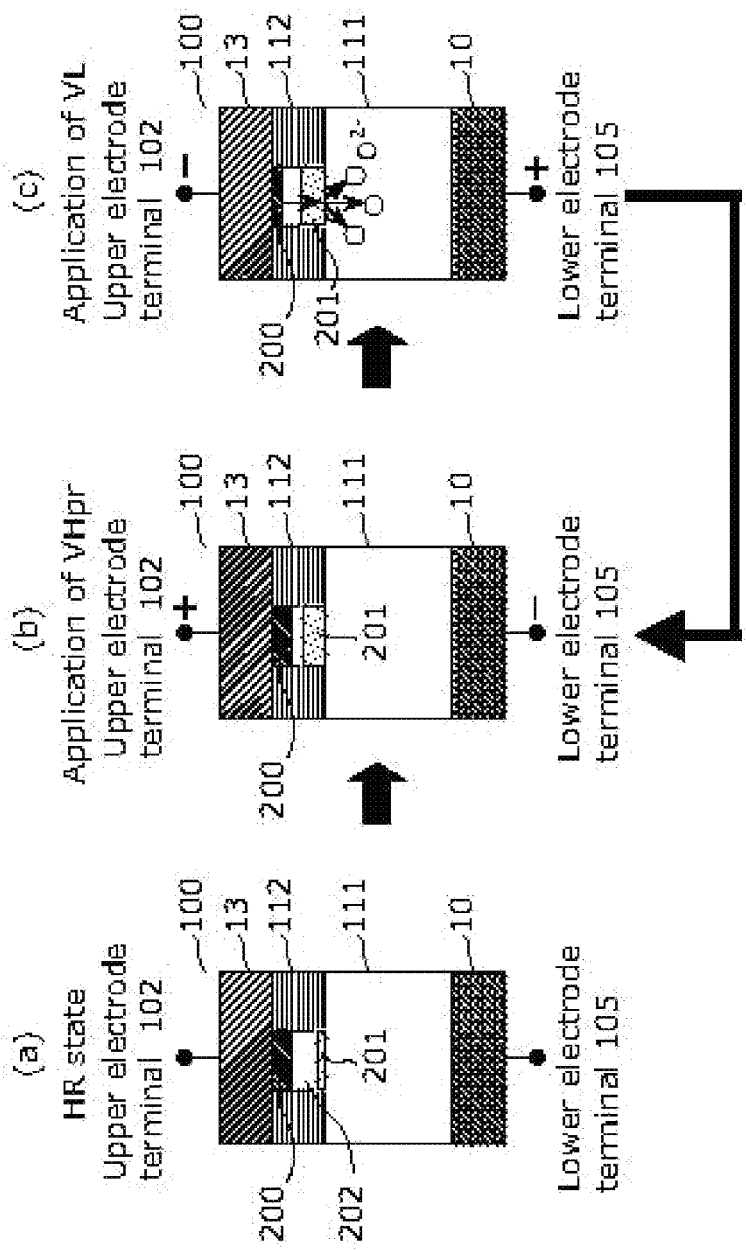
FIG. 12 is an explanatory diagram of an estimated mechanism in LR writing by preliminary voltage pulse application according to the present invention.

FIGS. 12(a) to 12(c) is an explanatory diagram of an estimated mechanism in LR writing by applying a preliminary voltage pulse for low resistance writing. In FIGS. 12(a) to 12(c), the same components as in FIG. 1 are given the same reference signs, and their description is omitted.

FIG. 12(a) shows the variable resistance element 100 in the high resistance (HR) state. In detail, in a conductive path 202 in the second transition metal oxide layer 112, the neighborhood of the interface with the upper electrode 13 is oxidized to a first high resistance state, thus forming a first interface high resistance layer film 200. Meanwhile, the neighborhood of the interface of the second transition metal oxide layer 112 with the first transition metal oxide layer 111 is oxidized to a second high resistance state that is lower in resistance value than the first high resistance state, thus forming a second interface high resistance layer film 201. It is assumed here that a threshold voltage for a resistance change of the second interface high resistance layer film 201 is lower than a threshold voltage for a resistance change of the first interface high resistance layer film 200.

FIG. 12(b) shows a state change of the second interface high resistance layer film 201 in the case where the preliminary voltage pulse VHpr for low resistance writing is applied to the variable resistance element 100. In detail, when the preliminary voltage pulse for low resistance writing in the direction to the high resistance state of the variable resistance layer is applied to the variable resistance element, the first interface high resistance layer film 200 is unchanged, but oxygen ions $O^{2-}$ in the second interface high resistance layer film 201 are drawn toward the upper electrode 13 and diffused. As a result, an oxygen ion $O^{2-}$ density in the second interface high resistance layer film 201 becomes lower than that in the second interface high resistance layer film 201 in the HR state in FIG. 12(a), and the variable resistance element 100 slightly decreases in resistance value though the second interface high resistance layer film 201 increases in film thickness.

FIG. 12(c) shows a state change of the first interface high resistance layer film 200 in the case where the voltage VL for low resistance writing is applied. In detail, as a result of applying the voltage VL for low resistance writing, oxygen ions $O^{2-}$ in the first interface high resistance layer film 200 are drawn into the first tantalum oxide layer (first transition metal oxide layer 111) and diffused. At this time, the second interface high resistance layer film 201 is likely to have a weak oxygen diffusion barrier function because oxygen ions $O^{2-}$ in the second interface high resistance layer film 201 have been reduced by the preliminary voltage pulse for low resistance writing applied beforehand. As a result, oxygen ions $O^{2-}$ in the first interface high resistance layer film 200 are speedily diffused into the first transition metal oxide layer 111. This contributes to a lower resistance value of the variable resistance element 100 than in the conventional low resistance writing operation.

Thus, when the application of the preliminary voltage pulse for low resistance writing and the application of the voltage pulse for low resistance writing described above are repeatedly performed, the second interface high resistance layer film 201 and the first interface high resistance layer film 200 gradually decrease in resistance value. It is therefore estimated that the cell current in the LR state increases as the number of times the voltage pulse set for low resistance writing is applied increases as shown in FIG. 8B.

HR writing by applying the preliminary voltage pulse for high resistance writing has substantially the same mechanism in the opposite direction (oxidation direction) of movement to LR writing. In detail, in the LR state, too, the second interface high resistance layer film 201 is present, and inhibits diffusion of oxygen ions $O^{2-}$ in high resistance writing and prevents sufficient formation of the first interface high resistance layer film 200. This being the case, oxygen ions $O^{2-}$ in the second interface high resistance layer film 201 are diffused into the first transition metal oxide layer 111 by applying the preliminary voltage pulse for high resistance writing beforehand, thereby reducing oxygen ions $O^{2-}$ in the second interface high resistance layer film 201 to reduce its oxygen diffusion barrier function. This facilitates speedy formation of the first interface high resistance layer film 200 in high resistance writing.

[Variable Resistance Nonvolatile Memory Element Writing Method in Embodiment 1]

The following describes a writing method of changing the variable resistance element 100 to the high resistance state and the low resistance state in a nonvolatile memory device in which each 1T1R memory cell uses the variable resistance element 100 shown in FIG. 1.

Figure 13A:
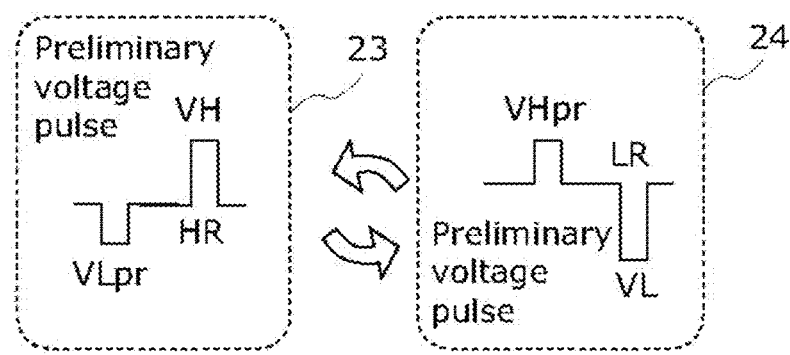
FIG. 13A is a schematic diagram showing a pulse waveform in the case where application of a voltage pulse set for high resistance (HR) writing and application of a voltage pulse set for low resistance (LR) writing are alternately performed in Embodiment 1.
Figure 13B:
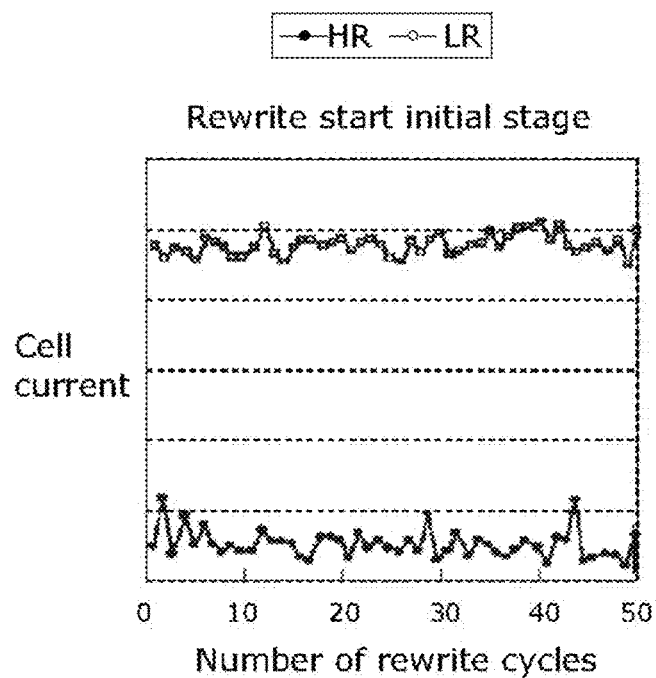
FIG. 13B is a rewrite characteristic diagram in a rewrite start initial stage in the case where the application of the voltage pulse set for high resistance writing and the application of the voltage pulse set for low resistance writing shown in FIG. 13A are alternately performed.
Figure 13C:
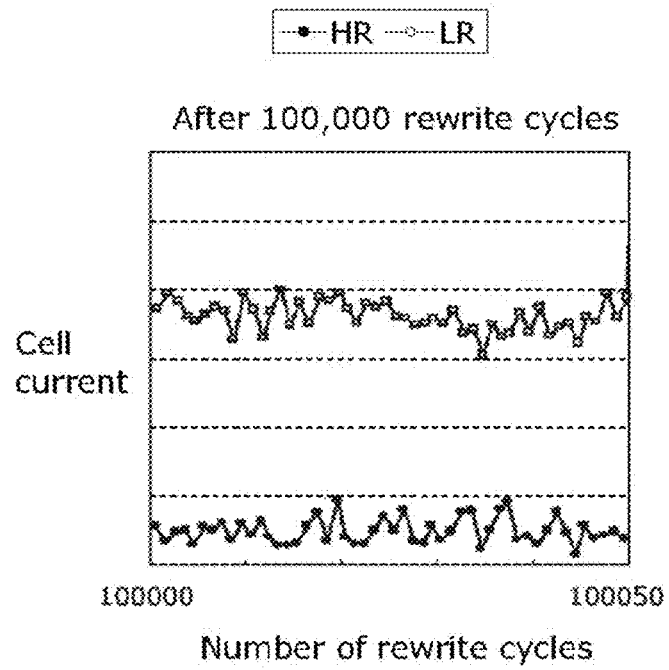
FIG. 13C is a rewrite characteristic diagram after 100,000 rewrite cycles in the case where the application of the voltage pulse set for high resistance writing and the application of the voltage pulse set for low resistance writing shown in FIG. 13A are alternately performed.

FIG. 13A is a schematic diagram showing a pulse waveform in the case where application of a voltage pulse set for high resistance (HR) writing and application of a voltage pulse set for low resistance (LR) writing are alternately performed in Embodiment 1. FIG. 13B is a rewrite characteristic diagram in a rewrite start initial stage in the case where the application of the voltage pulse set for high resistance (HR) writing and the application of the voltage pulse set for low resistance (LR) writing shown in FIG. 13A are alternately performed. FIG. 13C is a rewrite characteristic diagram after 100,000 rewrite cycles in the case where the application of the voltage pulse set for high resistance (HR) writing and the application of the voltage pulse set for low resistance (LR) writing shown in FIG. 13A are alternately performed. The vertical axis and the horizontal axis in FIGS. 13B and 13C are the same as those in FIG. 2B, and so their description is omitted.

The following describes the case where the voltage pulse set 23 for high resistance writing shown in FIG. 7A is applied in a high resistance writing operation and the voltage pulse set 24 for low resistance writing shown in FIG. 8A is applied in a low resistance writing operation, to the memory cell shown in FIG. 1. That is, the voltage pulse set 23 for high resistance writing and the voltage pulse set 24 for low resistance writing shown in FIG. 13A are alternately applied to the 1T1R memory cell using the variable resistance element shown in FIG. 1.

In other words, a writing method of applying the voltage pulse set 23 for high resistance writing or the voltage pulse set 24 for low resistance writing is the following. When changing the variable resistance element 100 from a first resistance state to a second resistance state, a first voltage pulse having a first polarity and a larger absolute value than a first threshold voltage is applied to the variable resistance element 100. When changing the variable resistance element 100 from the second resistance state to the first resistance state, a second voltage pulse having a second polarity different from the first polarity and a larger absolute value than a second threshold voltage is applied to the variable resistance element 100. In detail, the writing method includes applying a first preliminary voltage pulse and subsequently applying the first voltage pulse to the variable resistance element 100 when changing the variable resistance element 100 from the first resistance state to the second resistance state, the first preliminary voltage pulse being smaller in voltage absolute value than the second threshold voltage and different in polarity from the first voltage pulse. The writing method further includes applying a second preliminary voltage pulse and subsequently applying the second voltage pulse to the variable resistance element 100 when changing the variable resistance element 100 from the second resistance state to the first resistance state, the second preliminary voltage pulse being smaller in voltage absolute value than the first threshold voltage and different in polarity from the second voltage pulse. Here, the set of the first preliminary voltage pulse and the first voltage pulse corresponds to one of the voltage pulse set 23 for high resistance writing and the voltage pulse set 24 for low resistance writing in FIG. 13A, and the set of the second preliminary voltage pulse and the second voltage pulse corresponds to the other one of the voltage pulse set 23 for high resistance writing and the voltage pulse set 24 for low resistance writing in FIG. 13A.

Moreover, a writing method of alternately applying the voltage pulse set 23 for high resistance writing and the voltage pulse set 24 for low resistance writing repeatedly is the following. The writing method includes applying a first preliminary voltage pulse and subsequently applying the first voltage pulse to the variable resistance element 100 when changing the variable resistance element 100 from the first resistance state to the second resistance state, the first preliminary voltage pulse being smaller in voltage absolute value than the second threshold voltage and different in polarity from the first voltage pulse. The writing method further includes applying a second preliminary voltage pulse and subsequently applying the second voltage pulse to the variable resistance element 100 when changing the variable resistance element 100 from the second resistance state to the first resistance state, the second preliminary voltage pulse being smaller in voltage absolute value than the first threshold voltage and different in polarity from the second voltage pulse.

FIGS. 13B and 13C respectively show examples of rewrite characteristics in a rewrite initial state and a state after 100,000 rewrite cycles in the writing method of alternately applying the voltage pulse set 23 for high resistance writing and the voltage pulse set 24 for low resistance writing repeatedly. In detail, FIGS. 13A and 13B show rewrite characteristics in the case of performing the following writing (application). As shown in FIG. 13A, the preliminary voltage pulse VLpr for high resistance writing is applied and subsequently the voltage pulse VH for high resistance (HR) writing with a predetermined pulse width is applied to the memory cell in the low resistance state as the voltage pulse set 23 for high resistance writing. Following this, the preliminary voltage pulse VHpr for low resistance writing is applied and subsequently the voltage pulse VL for low resistance (LR) writing is applied to the memory cell in the high resistance state as the voltage pulse set 24 for low resistance writing (while the gate voltage VG' sufficient to turn on the transistor is applied to the gate terminal 103).

As shown in FIG. 13B, in the rewrite initial stage, the cell current in each of the high resistance (HR) state and the low resistance (LR) state is stable. As shown in FIG. 13C, even after 100,000 rewrite cycles, the cell current in the high resistance (HR) state maintains a stable state, and also the amount of shift of the cell current in the low resistance (LR) state to the high resistance direction is significantly improved as compared with the conventional writing method shown in FIG. 2C.

Thus, according to the writing method shown in FIG. 13A, by respectively applying the appropriate preliminary voltage pulse for high resistance writing (disturb voltage for high resistance writing) and the appropriate preliminary voltage pulse for low resistance writing (disturb voltage for low resistance writing) that differ in polarity from the voltage pulse for high resistance writing and the voltage pulse for low resistance writing beforehand, the high resistance writing capability and the low resistance writing capability can be improved. As a result, even when the number of rewrite cycles increases, an appropriate operating window can be secured, which contributes to improved reliability of the nonvolatile memory device.

Figure 14:
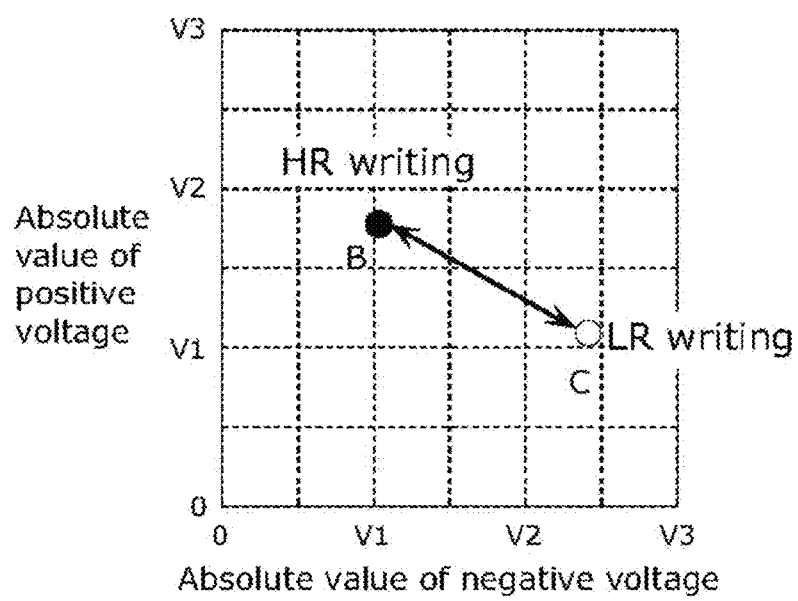
FIG. 14 is a diagram showing an operating point of a rewrite voltage in the case where the voltage pulse set for high resistance (HR) writing and the voltage pulse set for low resistance (LR) writing shown in FIG. 13A are alternately applied repeatedly.

FIG. 14 is a diagram showing an operating point of a rewrite voltage in the case where the voltage pulse set 23 for high resistance writing and the voltage pulse set 24 for low resistance writing shown in FIG. 13A are alternately applied repeatedly.

In FIG. 14, the horizontal axis represents an absolute value of a negative voltage applied to the nonvolatile memory device (memory cell), and the vertical axis represents an absolute value of a positive voltage applied to the nonvolatile memory device (memory cell). In FIG. 14, a point B represents an operating point in HR writing where the preliminary voltage pulse VLpr for high resistance writing is applied first and then the voltage VH for high resistance (HR) writing is applied as the voltage pulse set 23 for high resistance writing. Here, the point B is an operating point whose horizontal axis value indicates the preliminary voltage pulse VLpr for high resistance writing and whose vertical axis value indicates the voltage VH for high resistance (HR) writing. A point C represents an operating point in LR writing where the preliminary voltage pulse VHpr for low resistance writing is applied first and then the voltage VL for low resistance (LR) writing is applied as the voltage pulse set 24 for low resistance writing. Here, the point C is an operating point whose vertical axis value indicates the preliminary voltage pulse VHpr for low resistance writing and whose horizontal axis value indicates the voltage VL for low resistance (LR) writing.

As shown in FIG. 14, there are two operating points, i.e. the points B and C, while there is only one operating point (point A) in the conventional rewriting of one-pulse application shown in FIG. 3. This enables balance adjustment to be performed independently for the HR writing operation and the LR writing operation, so that the rewrite voltage can be selected with more freedom.

As described above, according to Embodiment 1, by respectively applying the appropriate preliminary voltage pulse for high resistance writing and the appropriate preliminary voltage pulse for low resistance writing that differ in polarity from the voltage pulse for high resistance writing and the voltage pulse for low resistance writing beforehand, the high resistance writing capability and the low resistance writing capability can be improved. As a result, even when the number of rewrite cycles increases, an appropriate operating window can be secured, which contributes to improved reliability of the nonvolatile memory device. Thus, a variable resistance nonvolatile memory element writing method for stably sustaining a resistance change operation by suppressing an operating window reduction caused by endurance (rewrite tolerance) characteristic deterioration can be realized.

Though this embodiment describes the case where the writing operation including the preliminary voltage pulse application is applied to both the high resistance writing operation and the low resistance writing operation, the writing operation including the preliminary voltage pulse application may be applied to only one of the high resistance writing operation and the low resistance writing operation.

[Embodiment 2]

The following describes a method different from the writing method in Embodiment 1, as Embodiment 2.

[Variable Resistance Nonvolatile Memory Element Writing Method in Embodiment 2]

The following describes another writing method of changing the variable resistance element 100 to the high resistance state and the low resistance state in a nonvolatile memory device in which each 1T1R memory cell uses the variable resistance element 100 shown in FIG. 1.

Figure 15A:
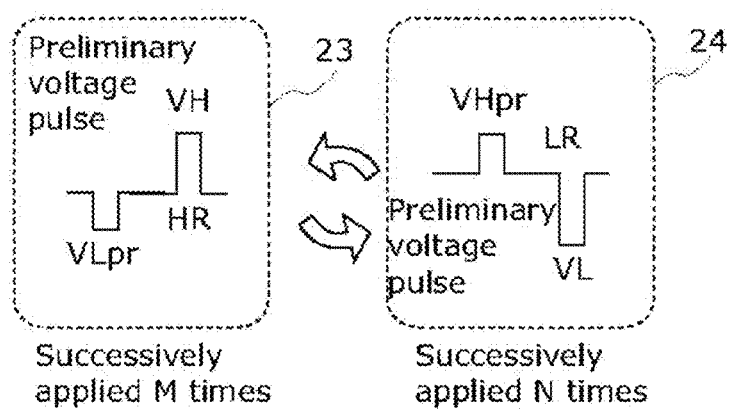
FIG. 15A is a schematic diagram showing a pulse waveform in the case where successive application of a voltage pulse set for high resistance (HR) writing M times and successive application of a voltage pulse set for low resistance (LR) writing N times are alternately performed in Embodiment 2.
Figure 15B:
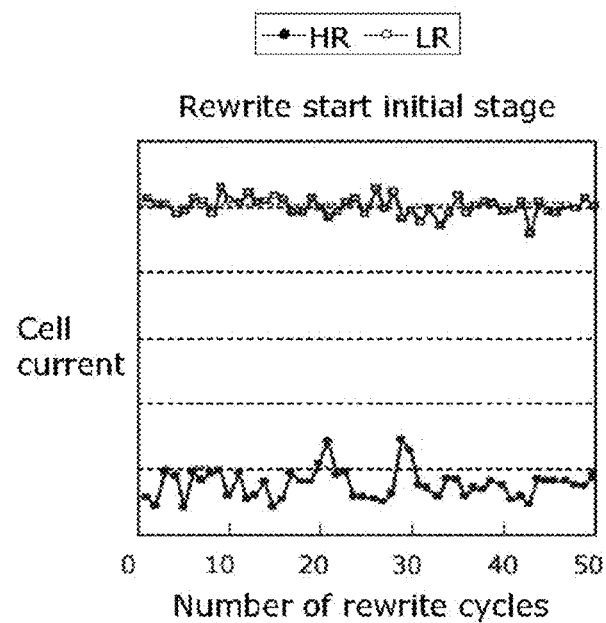
FIG. 15B is a rewrite characteristic diagram in a rewrite start initial stage in the case where the successive application of the voltage pulse set for high resistance writing and the successive application of the voltage pulse set for low resistance writing shown in FIG. 15A are alternately performed.
Figure 15C:
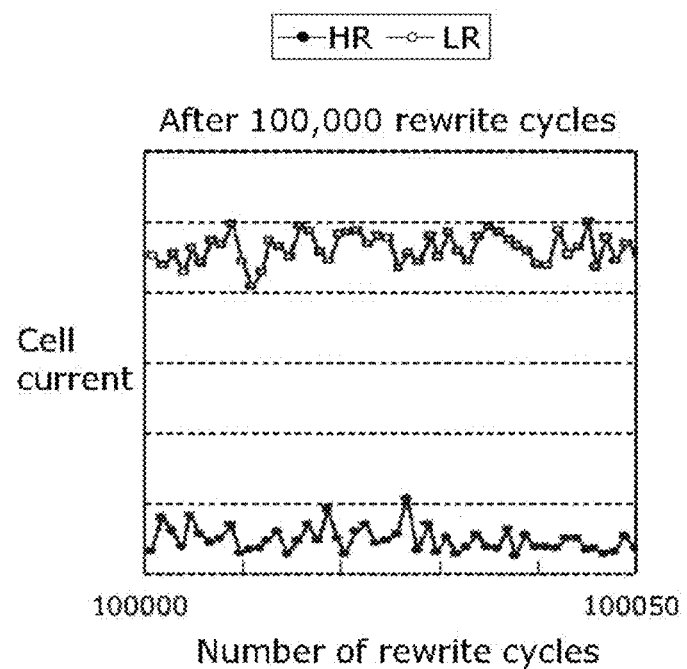
FIG. 15C is a rewrite characteristic diagram after 100,000 rewrite cycles in the case where the successive application of the voltage pulse set for high resistance writing and the successive application of the voltage pulse set for low resistance writing shown in FIG. 15A are alternately performed.

FIG. 15A is a schematic diagram showing a pulse waveform in the case where successive application of the voltage pulse set for high resistance (HR) writing M times and successive application of the voltage pulse set for low resistance (LR) writing N times are alternately performed in Embodiment 2. FIG. 15B is a rewrite characteristic diagram in a rewrite start initial stage in the case where the successive application of the voltage pulse set for high resistance writing and the successive application of the voltage pulse set for low resistance writing shown in FIG. 15A are alternately performed. FIG. 15C is a rewrite characteristic diagram after 100,000 rewrite cycles in the case where the successive application of the voltage pulse set for high resistance writing and the successive application of the voltage pulse set for low resistance writing shown in FIG. 15A are alternately performed. The vertical axis and the horizontal axis in FIGS. 15B and 15C are the same as those in FIG. 2B, and so their description is omitted.

In this embodiment, the high resistance writing operation and the low resistance writing operation are carried out by successively applying the voltage pulse set 23 for high resistance writing M times (M is an integer equal to or more than 1) and then successively applying the voltage pulse set 24 for low resistance writing N times (N is an integer equal to or more than 1) to the memory cell shown in FIG. 1, as shown in FIG. 15A.

The magnitude relationship between the number M of times the voltage pulse set for high resistance writing is successively applied and the number N of times the voltage pulse set for low resistance writing is successively applied is set so as to balance the HR state and the LR state when the number of rewrite cycles increases. For example, in the case where the amount of shift of the LR state to the HR direction is larger than the amount of shift of the HR state to the LR direction, the number N of times the voltage pulse set for low resistance writing is successively applied is set to be larger than the number M of times the voltage pulse set for high resistance writing is successively applied. In the case where the amount of shift of the HR state to the LR direction is larger than the amount of shift of the LR state to the HR direction, on the other hand, the number M of times the voltage pulse set for high resistance writing is successively applied is set to be larger than the number N of times the voltage pulse set for low resistance writing is successively applied.

Note that the number N of times the voltage pulse set for low resistance writing is successively applied and the number M of times the voltage pulse set for high resistance writing is successively applied may be set to be substantially equal in the case where the amount of shift of the HR state to the LR direction and the amount of shift of the LR state to the HR direction are substantially equal.

FIGS. 15B and 15C respectively show examples of rewrite characteristics in a rewrite initial state and a state after 100,000 rewrite cycles in the case where the successive application of the voltage pulse set 23 for high resistance writing M times and the successive application of the voltage pulse set 24 for low resistance writing N times shown in FIG. 15A are alternately performed repeatedly on the 1T1R memory cell using the variable resistance element 100 shown in FIG. 1. In detail, FIGS. 15A and 15B show rewrite characteristics in the case of performing the following writing (application). As shown in FIG. 15A, the voltage pulse set 23 for high resistance writing of applying the preliminary voltage pulse VLpr for high resistance writing first and then applying the voltage pulse VH for high resistance (HR) writing to the memory cell in the low resistance state is successively applied M times. Following this, the voltage pulse set 24 for low resistance writing of applying the preliminary voltage pulse VHpr for low resistance writing first and then applying the voltage pulse VL for low resistance (LR) writing to the memory cell in the high resistance state is successively applied N times (while the gate voltage VG' sufficient to turn on the transistor is applied to the gate terminal 103).

As shown in FIG. 15B, in the rewrite initial stage, the cell current in each of the high resistance (HR) state and the low resistance (LR) state is stable. As shown in FIG. 15C, even after 100,000 rewrite cycles, the cell current in the high resistance (HR) state maintains a relatively stable state, and also the amount of shift of the cell current in the low resistance (LR) state to the high resistance direction is very small, exhibiting a remarkable improvement from the conventional writing method shown in FIG. 2C.

Thus, according to the writing method shown in FIG. 15A, by setting a larger number of times the resistance change voltage pulse set is applied for a weaker one of the HR writing capability and the LR writing capability, appropriate balance between the HR writing capability and the LR writing capability can be attained. As a result, even when the number of rewrite cycles increases, an appropriate operating window can be secured, which contributes to significantly improved reliability of the nonvolatile memory device.

As described above, according to Embodiment 2, by applying the appropriate preliminary voltage pulse that differs in polarity from the corresponding one of the voltage pulse for high resistance writing and the voltage pulse for low resistance writing beforehand, the high resistance writing capability and the low resistance writing capability can be improved. As a result, even when the number of rewrite cycles increases, an appropriate operating window can be secured, which contributes to improved reliability of the nonvolatile memory device. Thus, a variable resistance nonvolatile memory element writing method for stably sustaining a resistance change operation by suppressing an operating window reduction caused by endurance (rewrite tolerance) characteristic deterioration can be realized.

Though this embodiment describes the case where the writing operation including the preliminary voltage pulse application is applied to both the high resistance writing operation and the low resistance writing operation, the writing operation including the preliminary voltage pulse application may be applied to only one of the high resistance writing operation and the low resistance writing operation as in Embodiment 1.

In the case where the number N of times the voltage pulse set for low resistance writing is successively applied or the number M of times the voltage pulse set for high resistance writing is successively applied is equal to or more than 2, the substantially same advantageous effects can be achieved even when the first application of the preliminary voltage pulse VLpr for high resistance writing or the first application of the preliminary voltage pulse VHpr for low resistance writing is omitted. This corresponds to the new variable resistance nonvolatile memory element writing method described with reference to FIGS. 7B and 8B.

[Embodiment 3]

The following describes an equivalent circuit of a circuit structure of a part necessary for rewriting, as Embodiment 3.

[Variable Resistance Nonvolatile Memory Element Writing Method in Embodiment 3]

Figure 16:
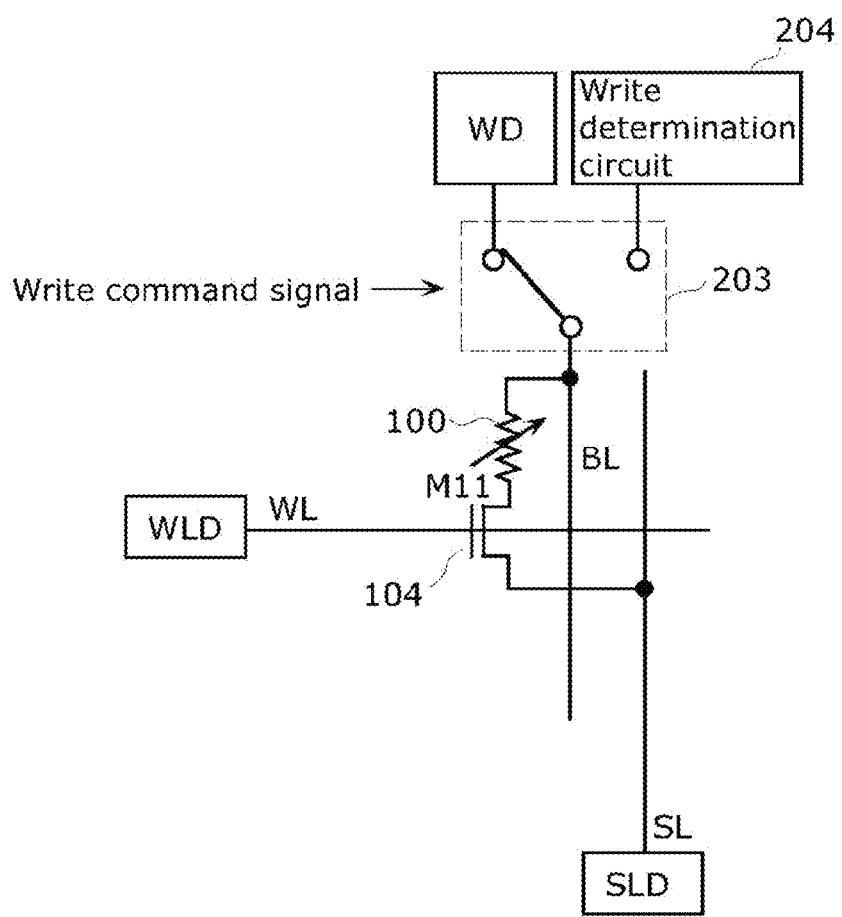
FIG. 16 is a diagram showing an example of an equivalent circuit of a circuit structure of a part necessary for rewriting according to the present invention.

FIG. 16 is a diagram showing an example of the equivalent circuit of the circuit structure of the part necessary for rewriting in the present invention.

As shown in FIG. 16, a bit line BL and the NMOS transistor 104 are connected to the variable resistance element 100 of a selected cell M11. The gate of the NMOS transistor 104 is connected to a word line driver circuit WLD via a selected word line WL, and the source of the NMOS transistor 104 is connected to a source line driver circuit SLD via a selected source line SL. The bit line BL is connected to a switch 203. The bit line BL is connected to a write driver circuit WD or a write determination circuit 204 according to a write command signal.

The word line driver circuit WLD is capable of applying a predetermined voltage to the selected word line WL. The source line driver circuit SLD is capable of applying a predetermined voltage to the selected source line SL. The write driver circuit WD is capable of applying a predetermined voltage to the selected bit line BL via the switch 203. The write determination circuit 204 detects a selected cell current flowing through the variable resistance element 100 via the selected bit line BL and the switch 203, and determines whether or not LR writing or HR writing is completed. In other words, the write determination circuit 204 determines whether or not first resistance state writing is completed, the first resistance state writing being writing for changing the variable resistance nonvolatile memory element to the first resistance state by the applying the first preliminary voltage pulse and subsequently applying the first voltage pulse. Here, the first resistance state writing corresponds to LR writing or HR writing, and the first resistance state change step corresponds to the voltage pulse set 23 for high resistance writing or the voltage pulse set 24 for low resistance writing.

The following describes an operation of the equivalent circuit shown in FIG. 16.

Figure 17:
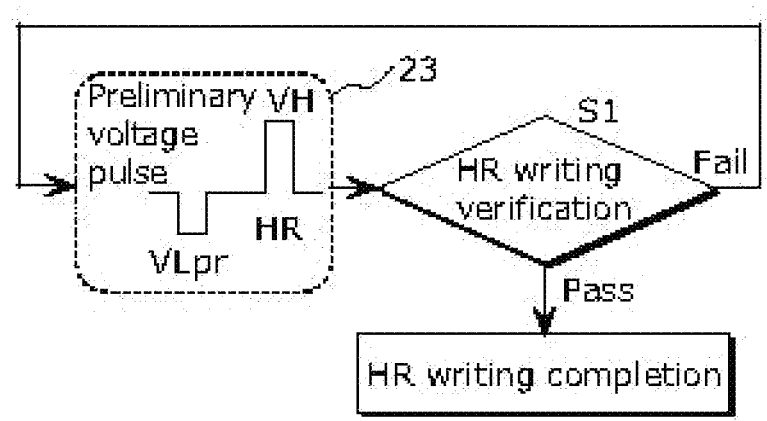
FIG. 17 is a diagram showing an operation flow of verification writing according to the present invention.
Figure 17:
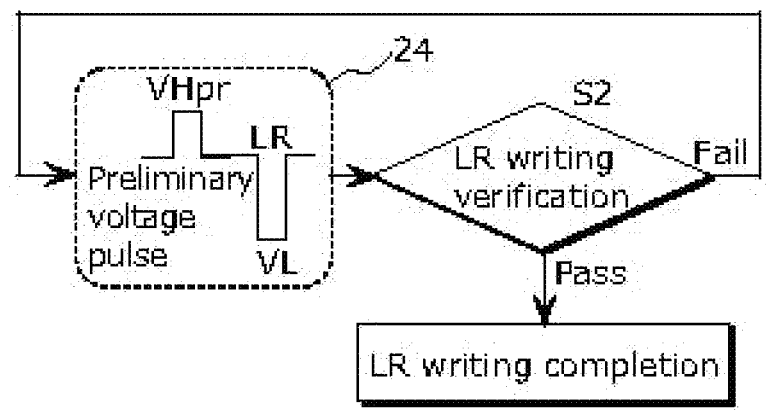

FIG. 17 is a diagram showing an operation flow of verification writing according to the present invention. In detail, FIG. 17 is an explanatory diagram of an operation flow of HR and LR writing verification of the equivalent circuit shown in FIG. 16.

An HR writing operation in FIG. 17 is described first.

First, to apply the preliminary voltage pulse VLpr for high resistance writing, the selected word line WL is activated (VG' is applied), the selected bit line BL is fixed at the ground potential, and VLpr (>0 V) is applied to the selected source line SL. Following this, to apply the voltage pulse VH for high resistance writing, the selected word line WL is activated (VG' is applied), the selected source line SL is fixed at the ground potential, and VH is applied to the selected bit line BL. Subsequently, the write determination circuit 204 connected to the selected bit line BL by the write command signal measures the HR cell current, and determines whether or not the HR cell current is less than a predetermined HR cell current level to determine whether or not HR writing is completed (HR writing verification S1). In the case where the HR writing verification S1 fails, the voltage pulse set 23 for high resistance writing is applied to the selected cell M11 and the HR writing verification S1 is performed again. This operation is repeated until the HR writing verification S1 passes.

An LR writing operation in FIG. 17 is described next.

First, to apply the preliminary voltage pulse VHpr for low resistance writing, the selected word line WL is activated (VG' is applied), the selected source line SL is fixed at the ground potential, and VHpr is applied to the selected bit line BL. Following this, to apply the voltage pulse VL for low resistance writing, the selected word line WL is activated (VG' is applied), the selected bit line BL is fixed at the ground potential, and VL (>0 V) is applied to the selected source line SL. Subsequently, the write determination circuit 204 connected to the selected bit line BL by the write command signal measures the LR cell current, and determines whether or not the LR cell current is more than a predetermined LR cell current level (e.g. 40 µA where the selected bit line voltage is 0.4 V) to determine whether or not LR writing is completed (LR writing verification S2). In the case where the LR writing verification S2 fails, the voltage pulse set 24 for low resistance writing is applied to the selected cell M11 and the LR writing verification S2 is performed again. This operation is repeated until the LR writing verification S2 passes.

As described above, the writing method in this embodiment includes: determining whether or not first resistance state writing is completed, the first resistance state writing being writing for changing the variable resistance element 100 to the first resistance state (e.g. high resistance state) by applying the first voltage pulse (e.g. for high resistance writing) in the applying the first preliminary voltage pulse and subsequently applying the first voltage pulse (e.g. in high resistance writing); and determining whether or not second resistance state writing is completed, the second resistance state writing being writing for changing the variable resistance element 100 to the second resistance state (e.g. low resistance state) by applying the second voltage pulse (e.g. for low resistance writing) in the applying the second preliminary voltage pulse and subsequently applying the second voltage pulse (e.g. in low resistance writing). The determining whether or not the first resistance state writing is completed is performed after the applying the first preliminary voltage pulse and subsequently applying the first voltage pulse, and the determining whether or not the second resistance state writing is completed is performed after the applying the second preliminary voltage pulse and subsequently applying the second voltage pulse. The applying the first preliminary voltage pulse and subsequently applying the first voltage pulse and the determining whether or not the first resistance state writing is completed are repeatedly performed until the variable resistance element 100 reaches the first resistance state, and the applying the second preliminary voltage pulse and subsequently applying the second voltage pulse and the determining whether or not the second resistance state writing is completed are repeatedly performed until the variable resistance element 100 reaches the second resistance state. Here, the first resistance state writing and the second resistance state writing each correspond to a different one of the LR writing and the HR writing, and the applying the first preliminary voltage pulse and subsequently applying the first voltage pulse and the applying the second preliminary voltage pulse and subsequently applying the second voltage pulse each correspond to a different one of the voltage pulse set 23 for high resistance writing and the voltage pulse set 24 for low resistance writing.

As described above, according to the writing method in this embodiment, even if the operating window is reduced as the number of rewrite cycles increases, the voltage pulse set for high resistance writing or the voltage pulse set for low resistance writing is forced to be applied a plurality of times until the verification passes. The high resistance level or the low resistance level can be appropriately improved in this way. Therefore, an appropriate operating window can be secured by balance adjustment, which contributes to improved reliability of the nonvolatile memory device.

Moreover, the use of such a verification writing method makes it unnecessary to successively apply the voltage pulse set for high resistance writing or the voltage pulse set for low resistance writing a fixed number of times, so that a shorter write time and a lower current consumption can be achieved.

The verification writing method does not necessarily need to be applied to both the high resistance writing operation and the low resistance writing operation, but may be applied to only one of the high resistance operation and the low resistance operation. The writing method in this case includes determining whether or not first resistance state writing is completed, the first resistance state writing being writing for changing the variable resistance element 100 to the first resistance state by the applying the first preliminary voltage pulse and subsequently applying the first voltage pulse, wherein the determining is performed after the applying the first preliminary voltage pulse and subsequently applying the first voltage pulse, and the applying the first preliminary voltage pulse and subsequently applying the first voltage pulse and the determining are repeatedly performed until the variable resistance element 100 reaches the first resistance state. Here, the first resistance state writing corresponds to any of the LR writing and the HR writing, and the applying the first preliminary voltage pulse and subsequently applying the first voltage pulse corresponds to any of the voltage pulse set 23 for high resistance writing and the voltage pulse set 24 for low resistance writing.

Though this embodiment describes, as an example structure of the equivalent circuit (memory device), the 1T1R memory cell formed by connecting one variable resistance element 100 to one NMOS transistor 104 which is the switching element, the present invention is not limited to the 1T1R memory cell. For example, a bidirectional diode may be used as the switching element.

[Embodiment 4]

Embodiment 3 describes the equivalent circuit including one memory cell as an example, for ease of explanation. However, the present invention can be actually implemented as a nonvolatile memory device in which a plurality of memory cells are arranged in an array. A specific example of this is described in this embodiment.

Figure 18:
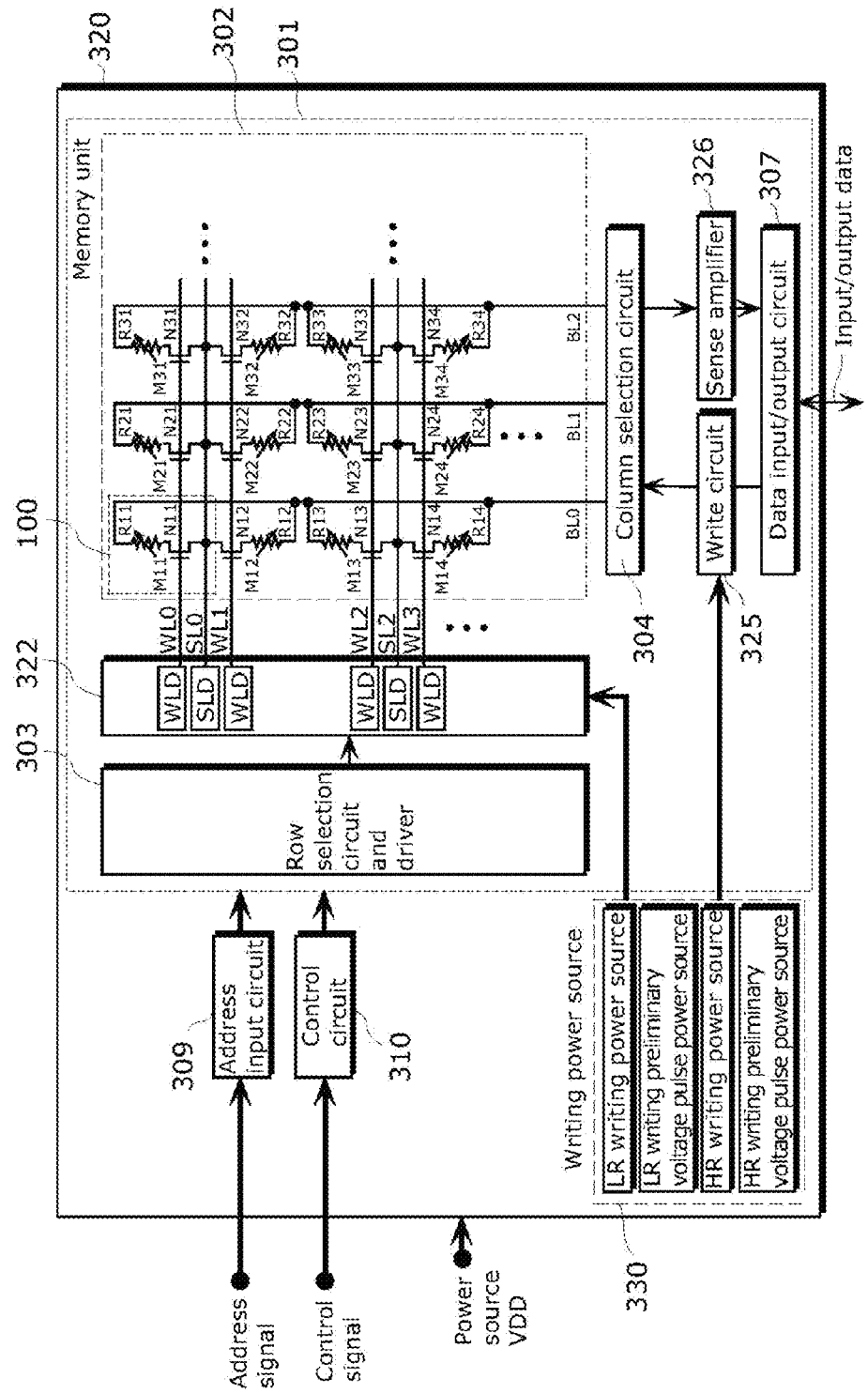
FIG. 18 is a block diagram showing a specific structure of a nonvolatile memory device having memory cells in array form according to the present invention.

FIG. 18 is a block diagram showing a structure of a nonvolatile memory device including memory cells of a specific array structure.

As shown in FIG. 18, a nonvolatile memory device 320 in this embodiment includes a memory unit 301 on a semiconductor substrate (not shown). The memory unit 301 includes: a memory cell array 302; a row selection circuit and driver 303; a column selection circuit 304; a write circuit 325 for writing information; and a sense amplifier 326 that detects a resistance value of a selected memory cell and determines whether data is "1" or "0". The nonvolatile memory device 320 also includes: a writing power source 330 that provides a plurality of power sources necessary for writing data to each memory cell; an address input circuit 309 that receives address signals from outside; a control circuit 310 that controls the operation of the memory unit 301 based on a control signal from outside; and a data input/output circuit 307 that performs input/output processing of input/output data.

The memory cell array 302 is formed on the semiconductor substrate, and includes: a plurality of first lines arranged in parallel with each other and extending in a first direction within a first plane that is substantially parallel to a surface of the semiconductor substrate (word lines WL0, WL1, WL2, . . . in the example of FIG. 18, hereafter referred to as "word lines WL0, WL1, WL2, . . . " for convenience's sake); a plurality of second lines arranged in parallel with each other and extending in a second direction within a second plane parallel to the first plane so as to three-dimensionally cross the first lines (bit lines BL0, BL1, BL2, . . . in the example in FIG. 18, hereafter referred to as "bit lines BL0, BL1, BL2, . . . " for convenience's sake); and memory cells M11, M12, M13, M21, M22, M23, M31, M32, M33, . . . (hereafter referred to as "memory cells M11, M12, . . . ") each provided at a different one of crosspoints of the word lines WL0, WL1, WL2, . . . and the bit lines BL0, BL1, BL2, . . . . Each of the memory cells M11, M12, . . . corresponds to the memory cell shown in FIG. 1, and includes the variable resistance element 100. The word lines WL0, WL1, WL2, . . . are connected to gates of selection transistors (NMOS transistors 104, hereafter also simply referred to as "transistors") N11, N12, N13, N21, N22, N23, N31, N32, N33, . . . (hereafter referred to as "transistors N11, N12, . . . ") included in the memory cells M11, M12, . . . . The bit lines BL0, BL1, BL2, . . . are connected to one terminals of variable resistance elements R11, R12, R13, R21, R22, R23, R31, R32, R33, . . . (hereafter referred to as "variable resistance elements R11, R12, . . . ") included in the memory cells M11, M12, . . . .

The variable resistance elements R11, R12, . . . (variable resistance elements 100) operate as nonvolatile memory elements in the memory cells M11, M12, . . . . Each of the memory cells M11, M12, . . . has one transistor and one variable resistance element 100, and so is called a 1T1R memory cell. The memory cell array 302 also includes a plurality of source lines SL0, SL1, SL2, . . . arranged in parallel with the word lines WL0, WL1, WL2, . . . . The source lines SL0, SL1, SL2, . . . are connected to other terminals of the transistors N11, N12, . . . included in the memory cells M11, M12, . . . .

The nonvolatile memory element in each of the memory cells M11, M12, . . . has a variable resistance layer comprising oxygen-deficient tantalum oxide, as mentioned earlier. In more detail, the nonvolatile memory element includes the lower electrode 10, the upper electrode 13, and the variable resistance layer 11 of the variable resistance element 100 shown in FIG. 1.

The transistors N11, N12, N13, . . . in the memory cell array 302 in FIG. 18 are n-channel MOS transistors as an example. The transistors N11, N12, N13, . . . each have a drain connected to the bit line BL0 via the variable resistance elements R11, R12, . . . . The transistors N21, N22, N23, . . . each have a drain connected to the bit line BL1 via the variable resistance elements. The transistors N31, N32, N33, . . . each have a drain connected to the bit line BL2 via the variable resistance elements.

The transistors N11, N21, N31, . . . each have a gate connected to the word line WL0. The transistors N12, N22, N32, . . . each have a gate connected to the word line WL1. The transistors N13, N23, N33, . . . each have a gate connected to the word line WL2.

The transistors N11, N21, N31, . . . and the transistors N12, N22, N32, . . . each have a source connected to the source line SL0. The transistors N13, N23, N33, . . . each have a source connected to the source line SL2. Note that the above-mentioned drain-source relationship is merely defined for convenience's sake, and is subjected to change depending on the application direction.

The address input circuit 309 receives address signals from an external circuit (not shown), and provides row address signals to the row selection circuit and driver 303 and column address signals to the column selection circuit 304 according to the received address signals, under control of the control circuit 310. Here, the address signals are signals showing an address of a specific memory cell selected from the plurality of memory cells M11, M12, . . . . The row address signals are signals showing an address of a row in the address shown by the address signals. The column address signals are signals showing an address of a column in the address shown by the address signals. The row selection circuit and driver 303 and the column selection circuit 304 constitute a selection circuit that selects at least one memory cell to be written or read in the memory cell array 302.

The control circuit 310 provides, in an information write cycle, a write command signal instructing to apply a write voltage, to the write circuit 325 according to the input data provided to the data input/output circuit 307. In a data read cycle, on the other hand, the control circuit 310 provides a read command signal instructing to perform a reading operation, to the sense amplifier 326 and the column selection circuit 304.

The row selection circuit and driver 303 receives the row address signals from the address input circuit 309. According to the received row address signals, the row selection circuit and driver 303 selects a word line from the plurality of word lines WL0, WL1, WL2, . . . , and applies a predetermined voltage to the selected word line.

The column selection circuit 304 receives the column address signals from the address input circuit 309. According to the received column address signals, the column selection circuit 304 selects a bit line from the plurality of bit lines BL0, BL1, BL2, . . . , and applies a write voltage or a read voltage to the selected bit line.

The writing power source 330 includes: an LR writing power source; a low resistance (LR) writing preliminary voltage pulse power source; an HR writing power source; and a high resistance (HR) writing preliminary voltage pulse power source.

The HR writing power source and the HR writing preliminary voltage pulse power source generate the voltage pulse for high resistance (HR) writing and the preliminary voltage pulse for high resistance writing included in the voltage pulse set 23 for high resistance writing. The LR writing power source and the LR writing preliminary voltage pulse power source generate the voltage pulse for low resistance (LR) writing and the preliminary voltage pulse for low resistance writing included in the voltage pulse set 24 for low resistance writing.

The write circuit 325 applies a predetermined potential to all bit lines or applies a write voltage pulse to a bit line selected by the column selection circuit 304, according to a write command from the control circuit 310.

The sense amplifier 326 is an example of a read circuit that reads a selected memory cell in the read cycle described above, and determines whether data is "1" or "0" based on a time difference of discharge of an applied read voltage. Output data obtained as a result is provided to the external circuit via the data input/output circuit 307.

Though the source lines (plate lines) are arranged in parallel with the word lines in the above example, the source lines may be arranged in parallel with the bit lines. Moreover, though the source lines each provide a common potential to the connected transistors in the above example, a source line selection circuit and driver of the same structure as the row selection circuit and driver may be provided to drive selected source lines and unselected source lines with different voltages (including polarities).

Though the above describes the 1T1R memory cell array as an example, the same writing method is applicable to a crosspoint memory cell array in which each memory cell includes a variable resistance element and a diode.

As described above, according to the present invention, a variable resistance nonvolatile memory element writing method for stably sustaining a resistance change operation by suppressing an operating window reduction caused by endurance (rewrite tolerance) characteristic deterioration can be realized. In detail, in the variable resistance nonvolatile memory element writing method according to the present invention, by applying the appropriate preliminary voltage pulse that differs in polarity from the corresponding one of the voltage pulse for high resistance writing and the voltage pulse for low resistance writing beforehand, the high resistance writing capability and the low resistance writing capability can be improved. As a result, even when the number of rewrite cycles increases, an appropriate operating window can be secured, which contributes to improved reliability of the nonvolatile memory device. Moreover, by setting a larger number of times the resistance change voltage pulse set is successively applied for a weaker one of the high resistance writing capability and the low resistance writing capability, appropriate balance between the high resistance writing capability and the low resistance writing capability can be attained without increasing the write voltage. As a result, even when the number of rewrite cycles increases, an appropriate operating window can be secured, which contributes to significantly improved reliability of the nonvolatile memory device. In addition, a low voltage operation can be achieved.

Though the above embodiments describe the case where the appropriate preliminary voltage pulse for high resistance writing and the appropriate preliminary voltage pulse for low resistance writing are respectively applied once before the voltage pulse for high resistance writing and the voltage pulse for low resistance writing, the present invention is not limited to such. The appropriate preliminary voltage pulse for high resistance writing and the appropriate preliminary voltage pulse for low resistance writing may be respectively applied a plurality of times before the voltage pulse for high resistance writing and the voltage pulse for low resistance writing. Besides, the time of application (pulse width) of the appropriate preliminary voltage pulse for high resistance writing and the appropriate preliminary voltage pulse for low resistance writing may be not fixed but changed according to need.

Though the variable resistance nonvolatile memory element writing method, the writing device, and the memory device according to the present invention have been described by way of the embodiments, the present invention is not limited to the embodiments. Variable resistance nonvolatile memory element writing methods realized by applying various changes conceivable by those skilled in the art to the embodiments and any combinations of components in different embodiments are also included in the present invention without departing from the scope of the present invention.

INDUSTRIAL APPLICABILITY

The variable resistance nonvolatile memory element writing method according to the present invention enables, especially in a variable resistance nonvolatile memory device having memory cells each of which includes a variable resistance element that reversibly changes in resistance value based on an electrical signal and a switching element such as a transistor, writing to be performed within a practical voltage range and also the number of times the nonvolatile memory device can be rewritten to be increased. The present invention is therefore useful as a writing method of a variable resistance nonvolatile memory element that realizes a high-reliability memory used in an electronic device such as a mobile phone or a notebook computer.

REFERENCE SIGNS LIST

10 Lower electrode
11 Variable resistance layer
13 Upper electrode
20 Voltage pulse for high resistance (HR) writing
21 Voltage pulse for low resistance (LR) writing
22 Voltage pulse for high resistance (HR) writing
23 Voltage pulse set for high resistance writing
24 Voltage pulse set for low resistance writing
100 Variable resistance element
100, 105 Lower electrode terminal
102 Upper electrode terminal
103 Gate terminal
104 NMOS transistor
111 First transition metal oxide layer
112 Second transition metal oxide layer
200 First interface high resistance layer film
201 Second interface high resistance layer film
202 Conductive path
203 Switch
204 Write determination circuit
301 Memory unit
302 Memory cell array
303 Row selection circuit and driver
304 Column selection circuit
307 Data input/output circuit
309 Address input circuit
310 Control circuit
320 Nonvolatile memory device
325 Write circuit
326 Sense amplifier
330 Writing power source
701 Variable resistance element
702 Selection transistor
703 Source line terminal
704 Word line terminal
705 Bit line terminal
706 Source line
707 Word line
708 Bit line
709 Memory cell

The invention claimed is:

1. A variable resistance nonvolatile memory element writing method of, by applying a voltage pulse to a memory cell including a variable resistance nonvolatile memory element, reversibly changing the variable resistance nonvolatile memory element between a first resistance state and a second resistance state according to a polarity of the applied voltage pulse,
wherein the variable resistance nonvolatile memory element includes a first electrode, a second electrode, and a variable resistance layer placed between the first electrode and the second electrode,
the variable resistance layer includes an oxygen-deficient first transition metal oxide layer that is in contact with the first electrode, and a second transition metal oxide layer that is in contact with the second electrode and is lower in oxygen deficiency than the first transition metal oxide layer, and
the variable resistance nonvolatile memory element has characteristics of changing to the first resistance state when, with respect to one of the first electrode and the second electrode, a first voltage pulse having a positive potential and equal to or more than a first threshold voltage is applied to an other one of the first electrode and the second electrode, and changing to the second resistance state when, with respect to the other one of the first electrode and the second electrode, a second voltage pulse having a positive potential and equal to or more than a second threshold voltage is applied to the one of the first electrode and the second electrode,
the variable resistance nonvolatile memory element writing method comprising
during a writing operation, successively applying a first voltage pulse set and a memory cell value measurement a plurality of times, the first voltage pulse set including a first preliminary voltage pulse and the first voltage pulse, wherein in the first voltage pulse set, the first voltage pulse is applied to the variable resistance nonvolatile memory element subsequent to the first preliminary voltage pulse when changing the variable resistance nonvolatile memory element from the second resistance state to the first resistance state, such that a value of the memory cell changes in accordance with each successive application of the first voltage pulse set, the first preliminary voltage pulse being smaller in voltage absolute value than the second threshold voltage and different in polarity from the first voltage pulse.

2. The variable resistance nonvolatile memory element writing method according to claim 1,
wherein the applying the first voltage pulse set is repeatedly performed the plurality of times to change the variable resistance nonvolatile memory element from the second resistance state to the first resistance state.

3. The variable resistance nonvolatile memory element writing method according to claim 1,
wherein the first resistance state is a high resistance state, and the second resistance state is a low resistance state that is lower in resistance than the high resistance state.

4. The variable resistance nonvolatile memory element writing method according to claim 1,
wherein the first resistance state is a low resistance state, and the second resistance state is a high resistance state that is higher in resistance than the low resistance state.

5. The variable resistance nonvolatile memory element writing method according to claim 1, further comprising
determining whether or not first resistance state writing is completed, the first resistance state writing being writing for changing the variable resistance nonvolatile memory element to the first resistance state by the applying the first voltage pulse set,
wherein the determining is performed after the applying the first voltage pulse set, and
the applying the first voltage pulse set and the determining are repeatedly performed the plurality of times until the variable resistance nonvolatile memory element reaches the first resistance state.

6. The variable resistance nonvolatile memory element writing method according to claim 1, further comprising
applying a second voltage pulse set including a second preliminary voltage pulse and the second voltage pulse to the variable resistance nonvolatile memory element when changing the variable resistance nonvolatile memory element from the first resistance state to the second resistance state, wherein in the second voltage pulse set, the second voltage pulse is applied to the variable resistance nonvolatile memory element subsequent to the second preliminary voltage pulse, the second preliminary voltage pulse being smaller in voltage absolute value than the first threshold voltage and different in polarity from the second voltage pulse.

7. The variable resistance nonvolatile memory element writing method according to claim 6,
wherein the applying the second voltage pulse set is repeatedly performed the plurality of times to change the variable resistance nonvolatile memory element from the first resistance state to the second resistance state.

8. The variable resistance nonvolatile memory element writing method according to claim 6, further comprising:
determining whether or not first resistance state writing is completed, the first resistance state writing being writing for changing the variable resistance nonvolatile memory element to the first resistance state by applying the first voltage pulse in the applying the first voltage pulse set; and
determining whether or not second resistance state writing is completed, the second resistance state writing being writing for changing the variable resistance nonvolatile memory element to the second resistance state by applying the second voltage pulse in the applying the second voltage pulse set,
wherein the determining whether or not the first resistance state writing is completed is performed after the applying the first voltage pulse set,
the determining whether or not the second resistance state writing is completed is performed after the applying the second voltage pulse set,
the applying the first voltage pulse set and the determining whether or not the first resistance state writing is completed are repeatedly performed the plurality of times until the variable resistance nonvolatile memory element reaches the first resistance state, and
the applying the second voltage pulse set and the determining whether or not the second resistance state writing is completed are repeatedly performed the plurality of times until the variable resistance nonvolatile memory element reaches the second resistance state.

9. The variable resistance nonvolatile memory element writing method according to claim 1,
wherein the first transition metal oxide layer and the second transition metal oxide layer comprise a transition metal that is any of tantalum, hafnium, and zirconium.

10. The variable resistance nonvolatile memory element writing method according to claim 1,
wherein the first transition metal oxide layer comprises a first transition metal, and the second transition metal oxide layer comprises a second transition metal different from the first transition metal, and
the second transition metal has a lower standard electrode potential than the first transition metal.

11. The variable resistance nonvolatile memory element writing method according to claim 1,
wherein the first transition metal oxide layer has a composition expressed as $TaO_x$ where $0.8 \leq x \leq 1.9$, and
the second transition metal oxide layer has a composition expressed as $TaO_y$ where $x < y$.

12. The variable resistance nonvolatile memory element writing method according to claim 1,
wherein the first preliminary voltage pulse is not zero volts.

13. The variable resistance nonvolatile memory element writing method according to claim 2, further comprising
applying a second voltage pulse set including a second preliminary voltage pulse and the second voltage pulse to the variable resistance nonvolatile memory element when changing the variable resistance nonvolatile memory element from the first resistance state to the second resistance state, wherein in the second voltage pulse set, the second voltage pulse is applied to the variable resistance nonvolatile memory element subsequent to the second preliminary voltage pulse, the second preliminary voltage pulse being smaller in voltage absolute value than the first threshold voltage and different in polarity from the second voltage pulse.

14. The variable resistance nonvolatile memory element writing method according to claim 13,
wherein the applying the second voltage pulse set is repeatedly performed the plurality of times to change the variable resistance nonvolatile memory element from the first resistance state to the second resistance state.

15. The variable resistance nonvolatile memory element writing method according to claim 1, further comprising
repeatedly performing the applying the first voltage pulse set the plurality of times so as to shift current of the memory cell more to a first resistance direction each time first resistance writing is performed, and applying a second voltage pulse set including a second preliminary voltage pulse and the second voltage pulse is equally repeatedly performed the plurality of times so as to shift the current of the memory cell more to a second resistance direction each time second resistance writing is performed, wherein in the second voltage pulse set, the second voltage pulse is applied subsequent to the second preliminary voltage pulse.

16. A variable resistance nonvolatile memory device comprising:
a memory cell including a variable resistance nonvolatile memory element; and a write control unit configured to, by applying a voltage pulse to the memory cell, perform writing for reversibly changing the variable resistance nonvolatile memory element between a first resistance state and a second resistance state according to a polarity of the applied voltage pulse, wherein the variable resistance nonvolatile memory element includes a first electrode, a second electrode, and a variable resistance layer placed between the first electrode and the second electrode, the variable resistance layer includes an oxygen-deficient first transition metal oxide layer that is in contact with the first electrode, and a second transition metal oxide layer that is in contact with the second electrode and is lower in oxygen deficiency than the first transition metal oxide layer, the variable resistance nonvolatile memory element has characteristics of changing to the first resistance state when, with respect to one of the first electrode and the second electrode, a first voltage pulse having a positive potential and equal to or more than a first threshold voltage is applied to an other one of the first electrode and the second electrode, and changing to the second resistance state when, with respect to the other one of the first electrode and the second electrode, a second voltage pulse having a positive potential and equal to or more than a second threshold voltage is applied to the one of the first electrode and the second electrode, and the write control unit is configured to, during a writing operation, successively apply a first voltage pulse set and a memory cell value measurement a plurality of times, the first voltage pulse set including a first preliminary voltage pulse and the first voltage pulse, wherein in the first voltage pulse set, the first voltage pulse is applied to the variable resistance nonvolatile memory element subsequent to the first preliminary voltage pulse when changing the variable resistance nonvolatile memory element from the second resistance state to the first resistance state, such that a value of the memory cell changes in accordance with each successive application of the first voltage pulse set, the first preliminary voltage pulse being smaller in voltage absolute value than the second threshold voltage and different in polarity from the first voltage pulse.

17. The variable resistance nonvolatile memory device according to claim 16,
wherein the memory cell further includes a switching element that is connected in series with the variable resistance nonvolatile memory element.

18. The variable resistance nonvolatile memory device according to claim 16,
wherein the first preliminary voltage pulse is not zero volts.

* * * * *